(12) United States Patent
Kim et al.

(10) Patent No.: US 9,129,950 B2
(45) Date of Patent: Sep. 8, 2015

(54) SEMICONDUCTOR DEVICES

(71) Applicants: Jeeyong Kim, Hwaseong-si (KR); Woonkyung Lee, Seongnam-si (KR); Sunggil Kim, Suwon-si (KR); Jin-Kyu Kang, Seoul (KR); Jung-Hwan Lee, Suwon-si (KR); Bonyoung Koo, Suwon-si (KR); Kihyun Hwang, Seongnam-si (KR); Byoungsun Ju, Seongnam-si (KR); Jintae Noh, Suwon-si (KR)

(72) Inventors: Jeeyong Kim, Hwaseong-si (KR); Woonkyung Lee, Seongnam-si (KR); Sunggil Kim, Suwon-si (KR); Jin-Kyu Kang, Seoul (KR); Jung-Hwan Lee, Suwon-si (KR); Bonyoung Koo, Suwon-si (KR); Kihyun Hwang, Seongnam-si (KR); Byoungsun Ju, Seongnam-si (KR); Jintae Noh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/568,737

(22) Filed: Dec. 12, 2014

(65) Prior Publication Data

US 2015/0145018 A1 May 28, 2015

Related U.S. Application Data

(63) Continuation of application No. 13/905,375, filed on May 30, 2013, now abandoned, which is a continuation of application No. 13/037,502, filed on Mar. 1, 2011, now Pat. No. 8,476,692.

(30) Foreign Application Priority Data

Mar. 4, 2010 (KR) .................. 10-2010-0019544

(51) Int. Cl.
H01L 29/49 (2006.01)
H01L 21/28 (2006.01)
H01L 23/48 (2006.01)
H01L 29/788 (2006.01)
H01L 29/792 (2006.01)
H01L 21/768 (2006.01)
H01L 27/115 (2006.01)

(52) U.S. Cl.
CPC ............ H01L 29/4958 (2013.01); H01L 21/28 (2013.01); H01L 21/76841 (2013.01); H01L 23/48 (2013.01); H01L 27/11526 (2013.01); H01L 29/788 (2013.01); H01L 29/792 (2013.01); *H01L 2924/0002* (2013.01)

(58) Field of Classification Search
CPC ................ H01L 29/4958; H01L 27/11526; H01L 2924/0002
USPC .......................................... 257/315, 324, 734
See application file for complete search history.

(56) References Cited

U.S. PATENT DOCUMENTS

| 5,818,092 A | 10/1998 | Bai et al. |
| 2005/0277237 A1 | 12/2005 | Wang et al. |
| 2008/0315280 A1* | 12/2008 | Watanabe et al. ............. 257/315 |

FOREIGN PATENT DOCUMENTS

| JP | 2000-307110 | 11/2000 |
| JP | 2009-070840 | 4/2009 |

(Continued)

*Primary Examiner* — Tran Tran
(74) *Attorney, Agent, or Firm* — Myers Bigel Sibley & Sajovec

(57) ABSTRACT

Provided are a semiconductor device and a method of manufacturing the semiconductor device. The semiconductor device includes a charge storage pattern formed on a substrate; a dielectric pattern formed on the charge storage pattern; a first conductive pattern including silicon doped with a first impurity of a first concentration, the first conductive pattern being disposed on the dielectric pattern; and a second conductive pattern including metal silicide doped with a second impurity of a second concentration, the second conductive pattern being disposed on the first conductive pattern. The first concentration may be higher than the second concentration.

30 Claims, 25 Drawing Sheets

(56) References Cited

FOREIGN PATENT DOCUMENTS

| KR | 100149528 B1 | 6/1998 |
| KR | 1020010076839 A | 8/2001 |
| KR | 1020050122111 A | 12/2005 |
| KR | 1020070041374 A | 4/2007 |

\* cited by examiner

Tested sample

SEMICONDUCTOR DEVICES

CROSS-REFERENCE TO RELATED APPLICATIONS

The present application is a continuation of U.S. patent application Ser. No. 13/905,375, filed May 30, 2013, which a continuation of U.S. patent application Ser. No. 13/037,502, filed Mar. 1, 2011, now U.S. Pat. No. 8,476,692 which claims priority under 35 U.S.C. §119 of Korean Patent Application No. 10-2010-0019544, filed Mar. 4, 2010, the contents of which are hereby incorporated herein by reference as if set forth fully in their entireties.

BACKGROUND

Embodiments disclosed herein relate to semiconductor devices and methods of manufacturing the same, and more particularly, to a nonvolatile memory devices and methods of manufacturing the same.

As the integration of semiconductor devices increases, a flash memory device including a control gate formed from metal silicide is suggested to improve an electric resistance characteristic. Metal of metal silicide included in a control gate may be continuously diffused in a subsequent thermal process. In particular, in the case that the metal is diffused to a dielectric pattern, an electrical defect of a semiconductor memory device may occur.

SUMMARY

Embodiments of the inventive concept provide semiconductor devices. The semiconductor devices may include a charge storage pattern formed on a substrate; a dielectric pattern formed on the charge storage pattern; a first conductive pattern including silicon doped with a first impurity of a first concentration, the first conductive pattern being disposed on the dielectric pattern; and a second conductive pattern including metal silicide doped with a second impurity of a second concentration, the second conductive pattern being disposed on the first conductive pattern. The first concentration may be higher than the second concentration.

Embodiments of the inventive concept also provide methods of manufacturing semiconductor devices. The methods may include forming a charge storage pattern and a dielectric pattern on a substrate; forming a first conductive pattern including silicon doped with a first impurity of a first concentration on the dielectric pattern; forming a preliminary second conductive pattern including silicon doped with a second impurity of a second concentration on the first conductive pattern; forming a metal layer on the preliminary second conductive pattern; and forming a second conductive pattern including metal silicide by performing a silidation process on the preliminary second conductive pattern and the metal layer. The first concentration is higher than the second concentration.

Embodiments of the inventive concept also provide semiconductor devices. The devices may include a first conductive pattern including silicon doped with a first impurity of a first concentration, the first conductive pattern being formed on a lower structure; and a second conductive pattern including metal silicide doped with a second impurity of a second concentration, the second conductive pattern being formed on the first conductive pattern. The first concentration is higher than the second concentration.

Some embodiments include methods of manufacturing semiconductor devices. Such methods may include forming a first conductive pattern including silicon doped with a first impurity of a first concentration on a lower structure and forming a second conductive pattern on the first conductive pattern, the second conductive pattern including metal silicide doped with a second impurity of a second concentration that is lower than the first concentration.

In some embodiments, forming the second conductive pattern includes forming a second conductive layer including the silicon doped with the second impurity of the second concentration on the first conductive pattern and patterning the second conductive layer to form the second conductive pattern. Some embodiments provide that the first conductive layer and the second conductive layer include silicon doped with the first and second impurities that may include carbon (C), oxygen (O), nitrogen (N), germanium (Ge), arsenic (As), boron (B), fluorine (F) or combinations thereof.

Some embodiments include forming a third conductive pattern including silicon doped with a third impurity of a third concentration that is lower than the first concentration. In some embodiments, forming the third conductive pattern includes forming a third conductive layer of silicon doped with the second impurity including carbon (C), oxygen (O), nitrogen (N), germanium (Ge), arsenic (As), boron (B), fluorine (F) or combinations thereof and patterning the third conductive layer to form the third conductive pattern. In some embodiments, the first concentration is about ten times through about thirty times as high as the second and third concentrations.

Some embodiments include forming a fourth conductive pattern including silicon doped with a fourth impurity of a fourth concentration that is substantially lower than the first concentration. The fourth conductive pattern may be formed between the first conductive pattern and the second conductive pattern.

Some embodiments provide that the lower structure includes a charge storage pattern formed on a substrate and a dielectric pattern formed on the charge storage pattern.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept.

DETAILED DESCRIPTION OF THE EMBODIMENTS

Figure 1A:
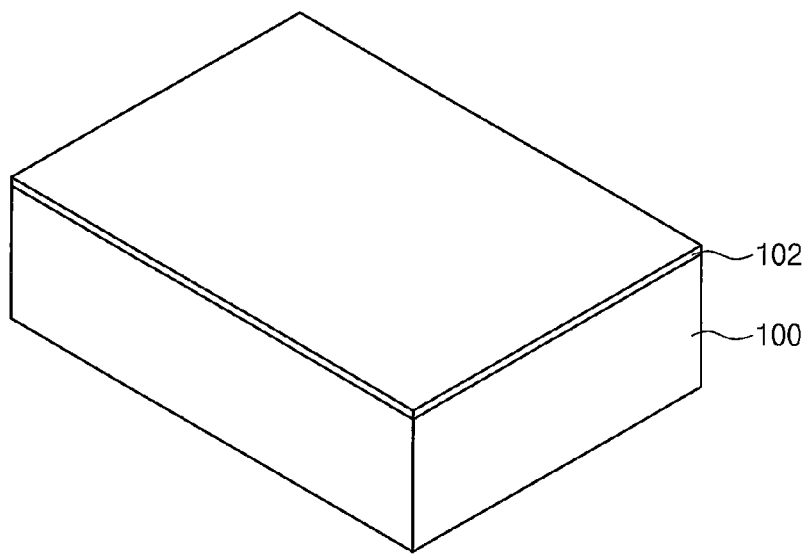
FIGS. 1A through 1N are perspective views for illustrating methods of manufacturing semiconductor devices in accordance with some embodiments of the inventive concept.

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present.

Embodiments of the inventive concept may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 1B:
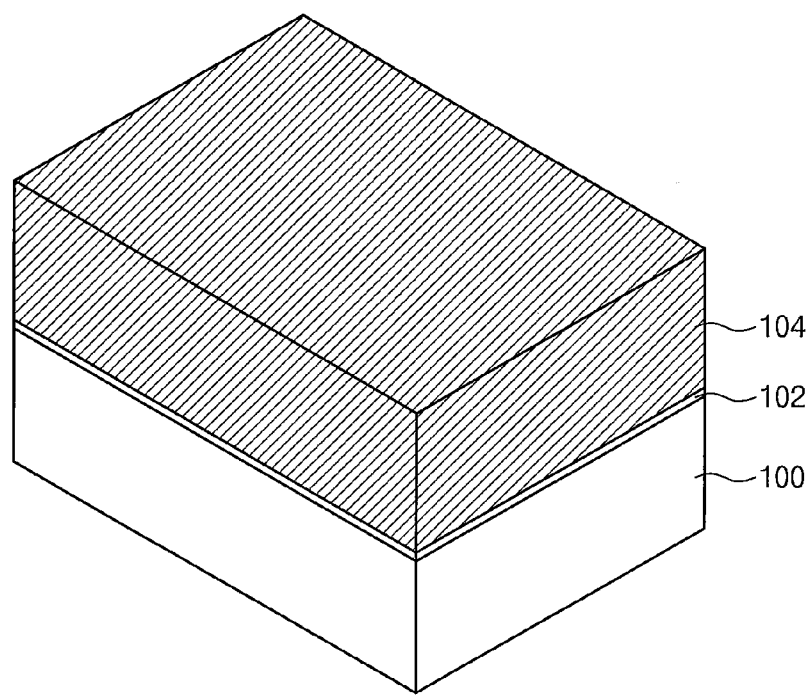
FIGS. 1O and 1P are cross sectional views taken along the lines A-A' and B-B' of the semiconductor devices illustrated in FIG. 1N, respectively.
Figure 1C:
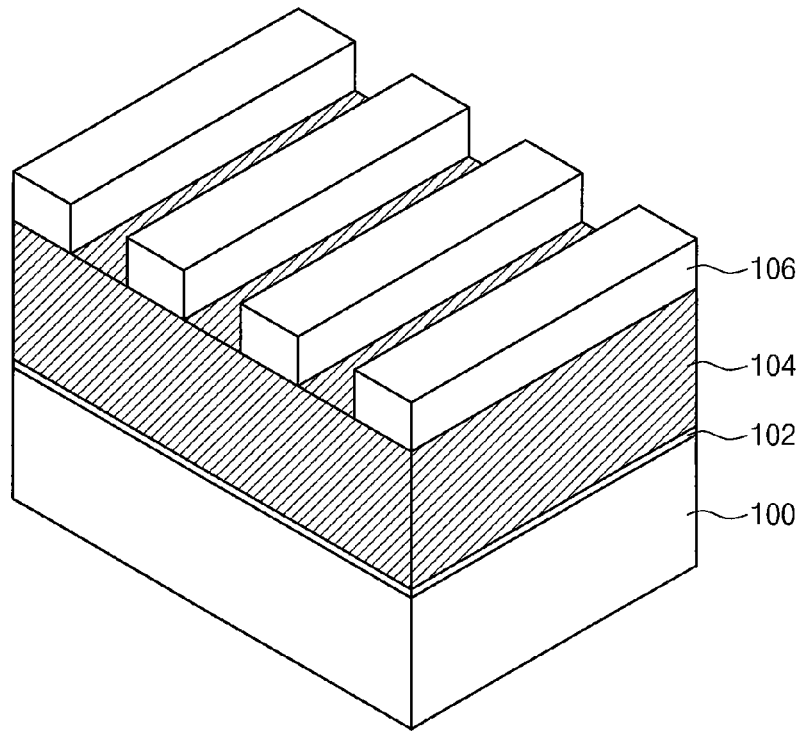
Figure 1D:
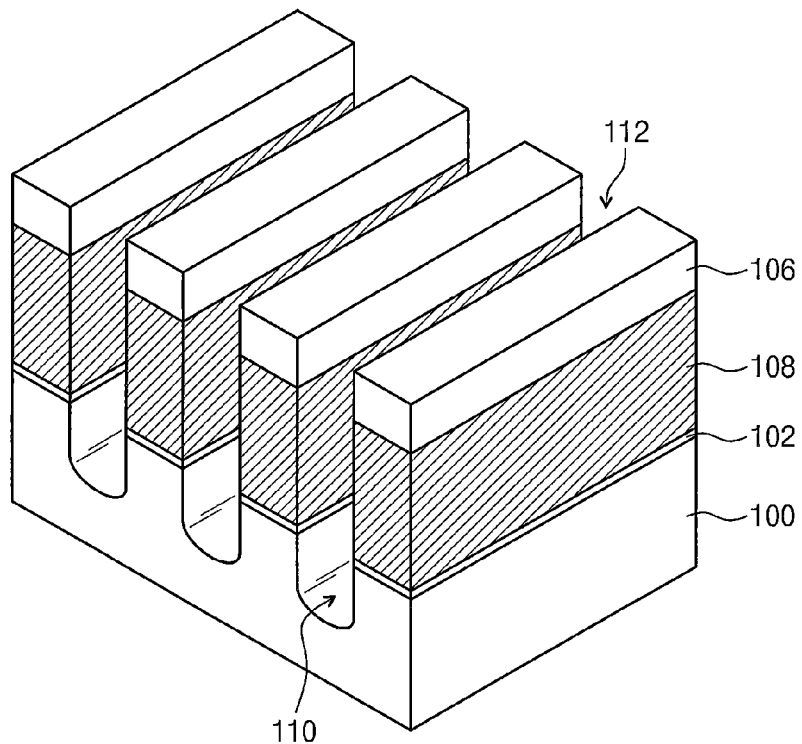
Figure 1E:
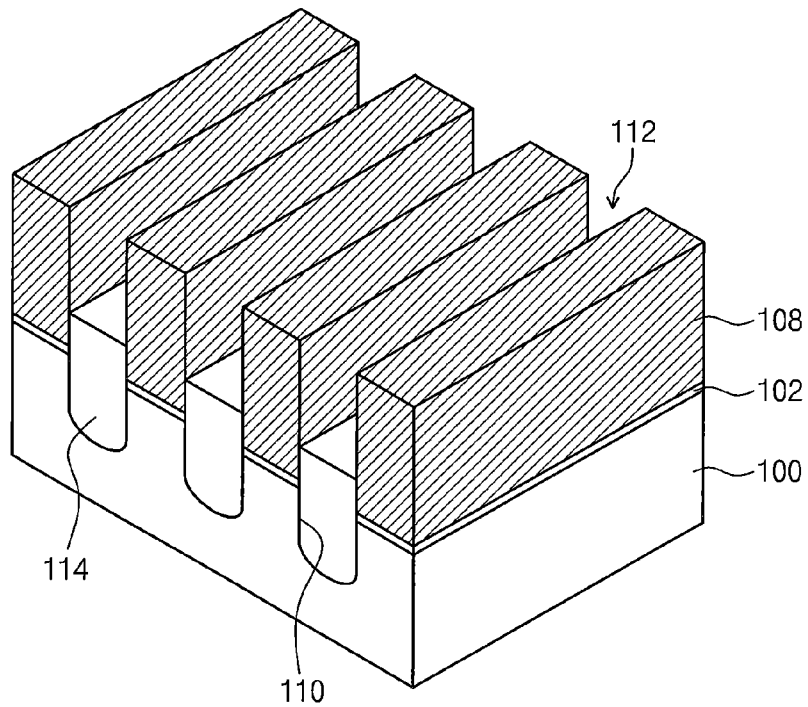
Figure 1F:
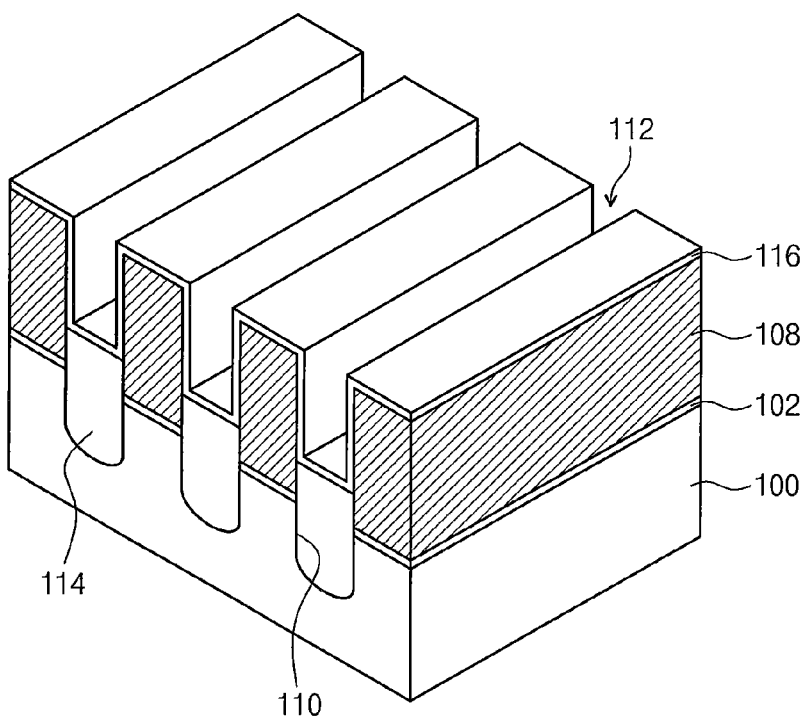
Figure 1G:
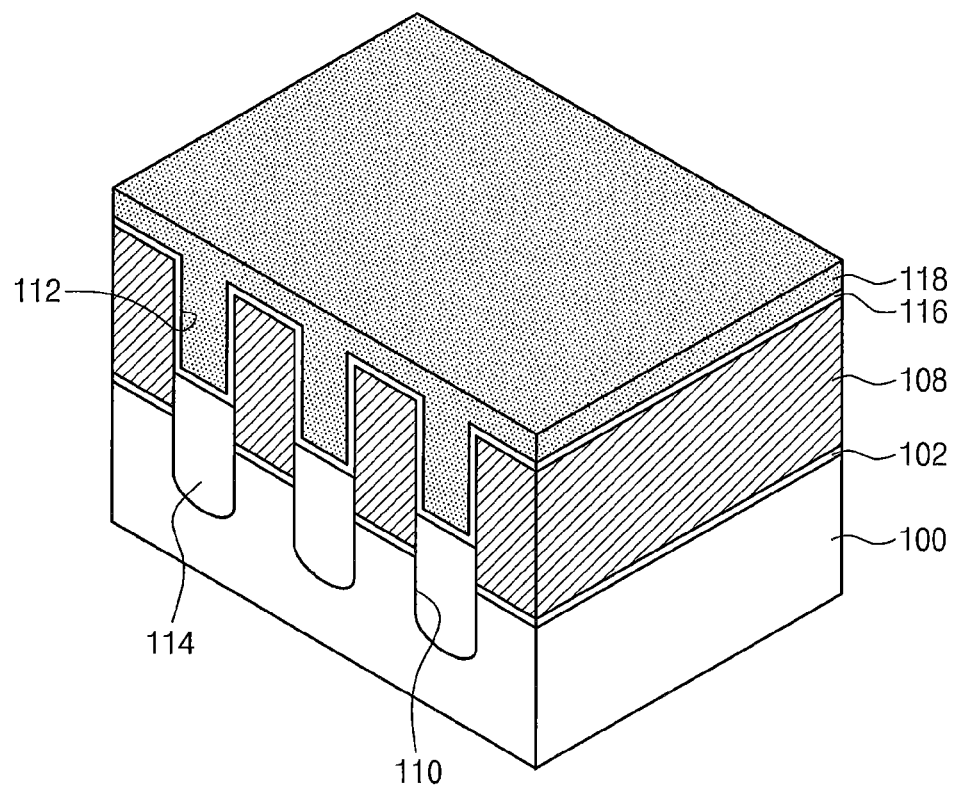
Figure 1H:
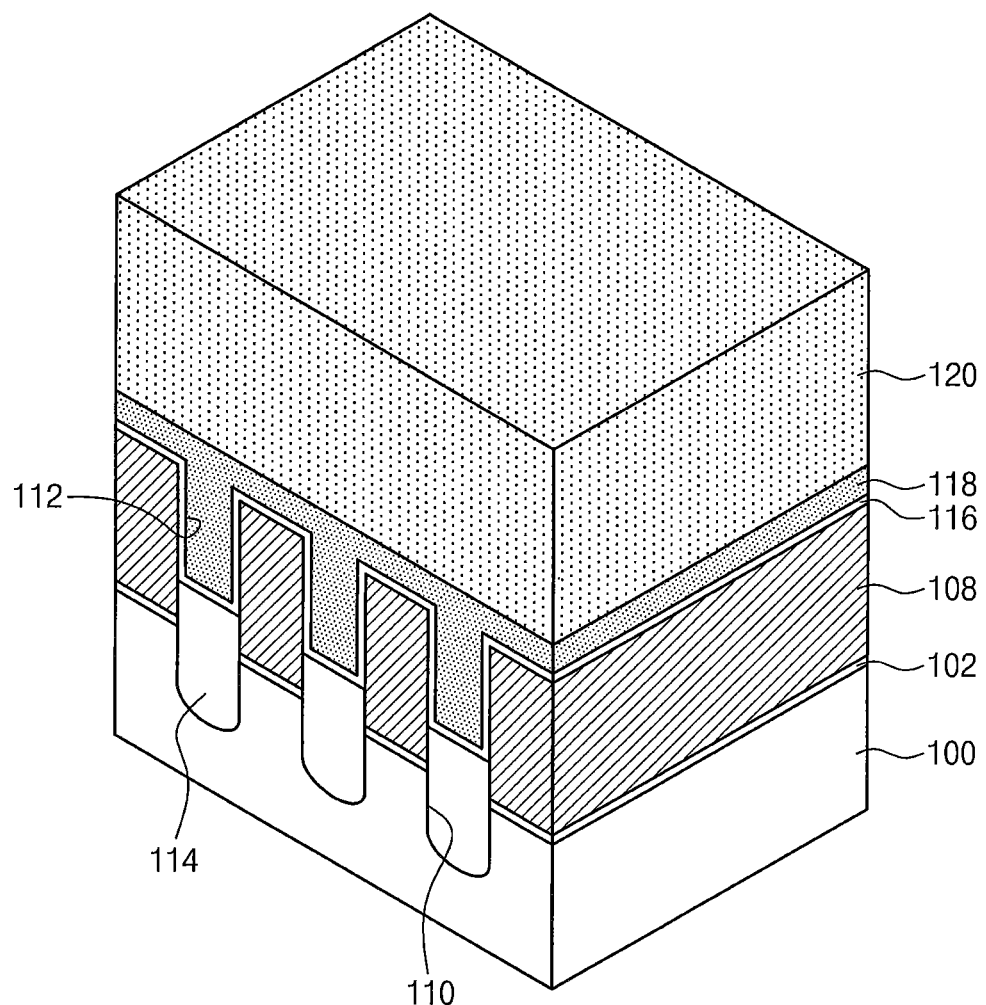
Figure 1I:
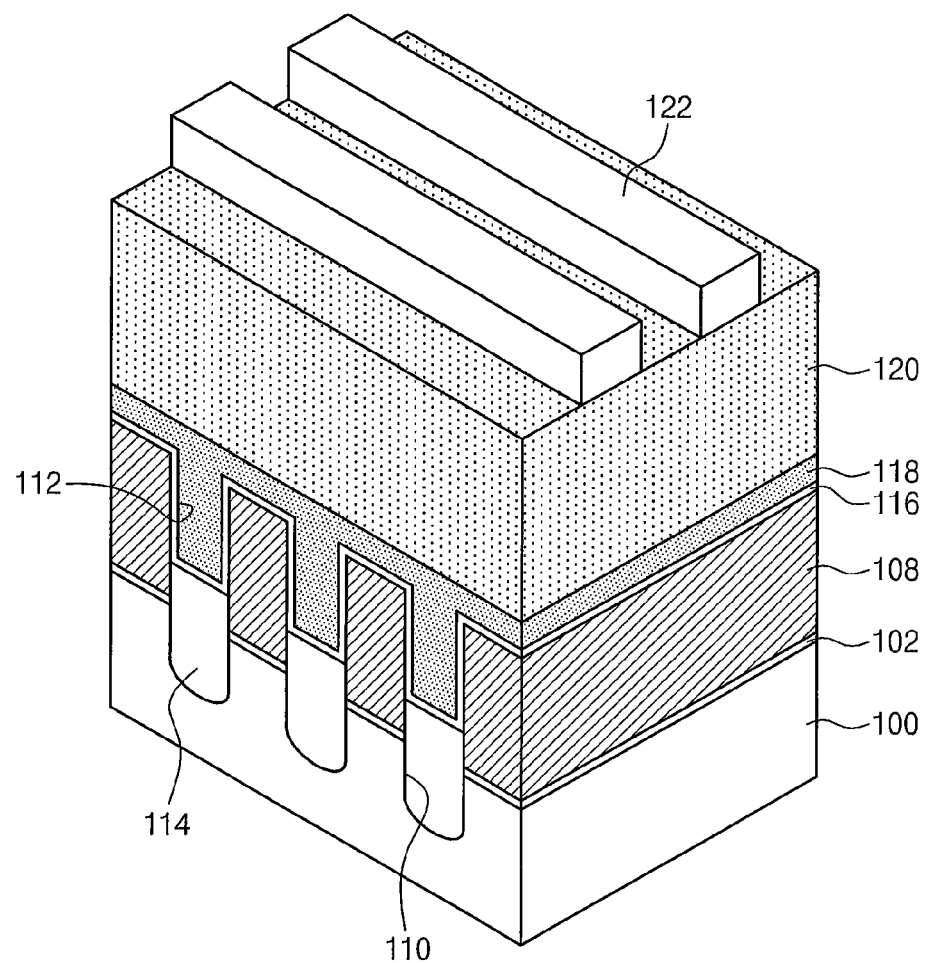
Figure 1J:
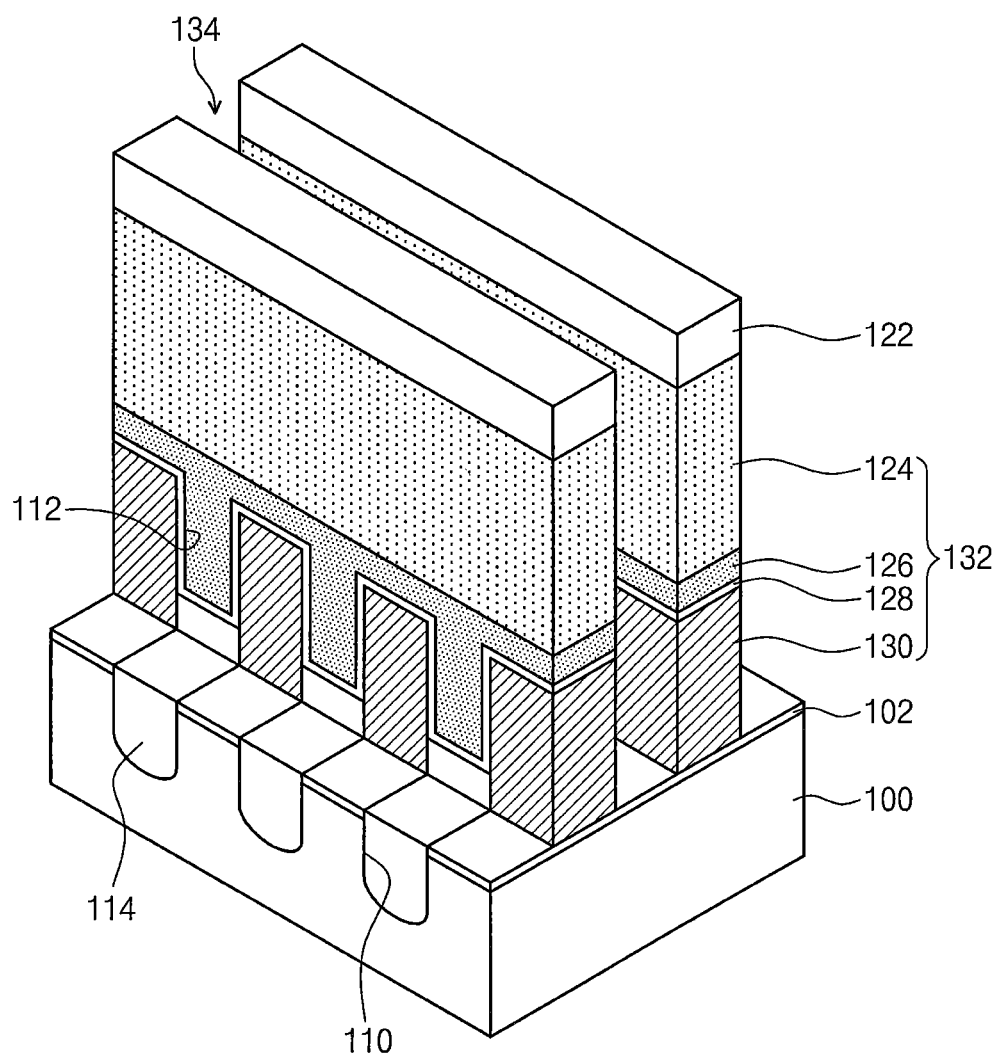
Figure 1K:
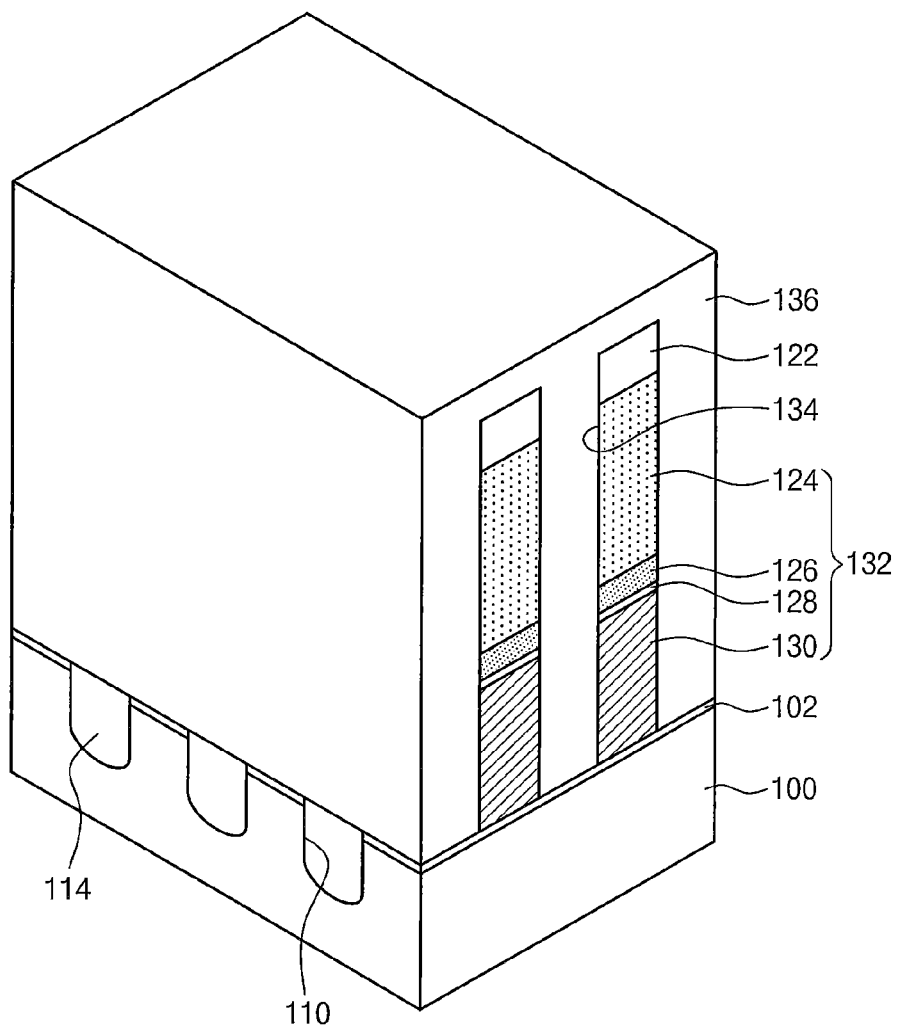
Figure 1L:
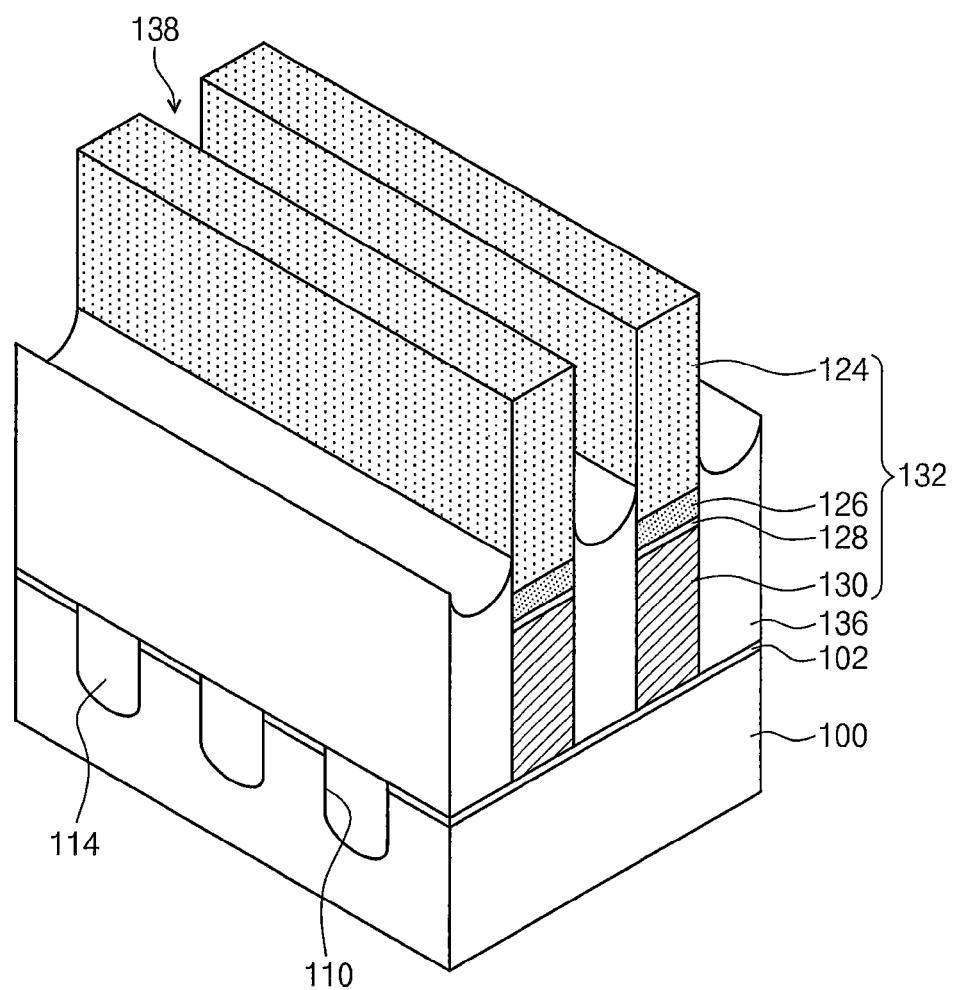
Figure 1M:
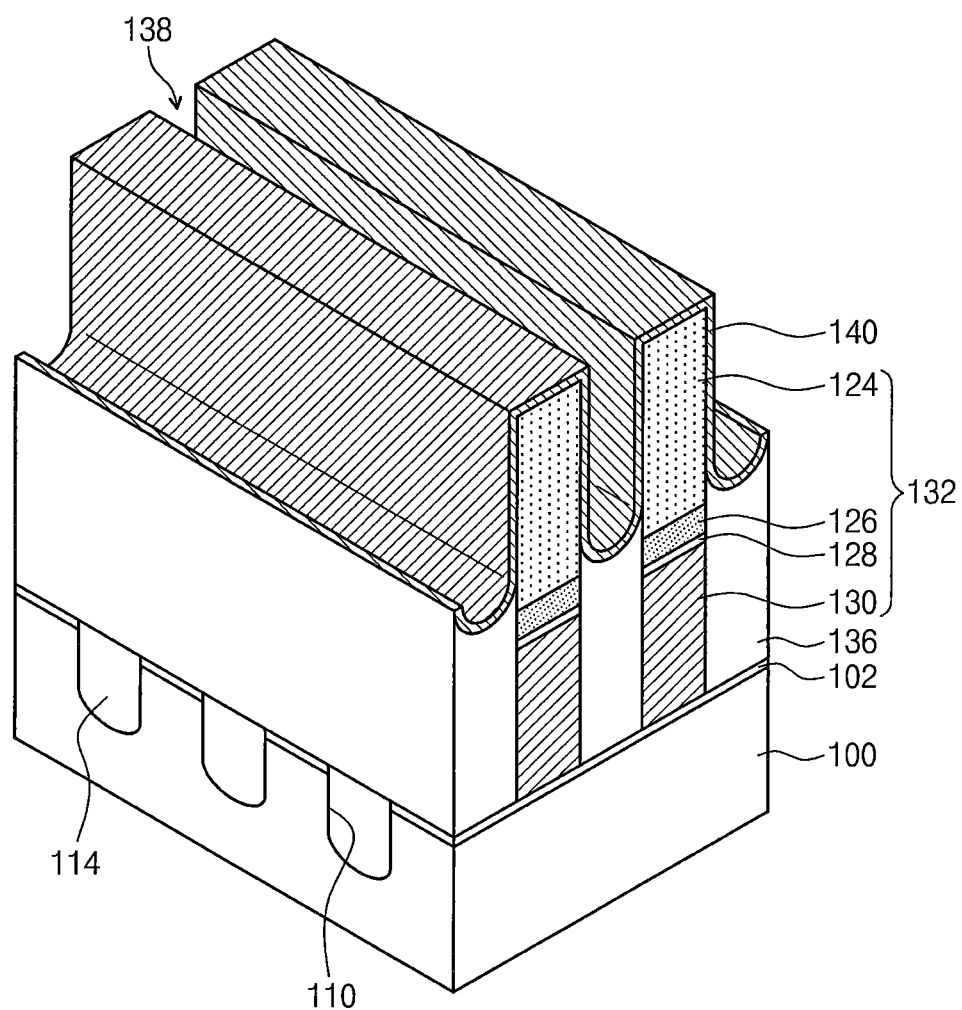
Figure 1N:
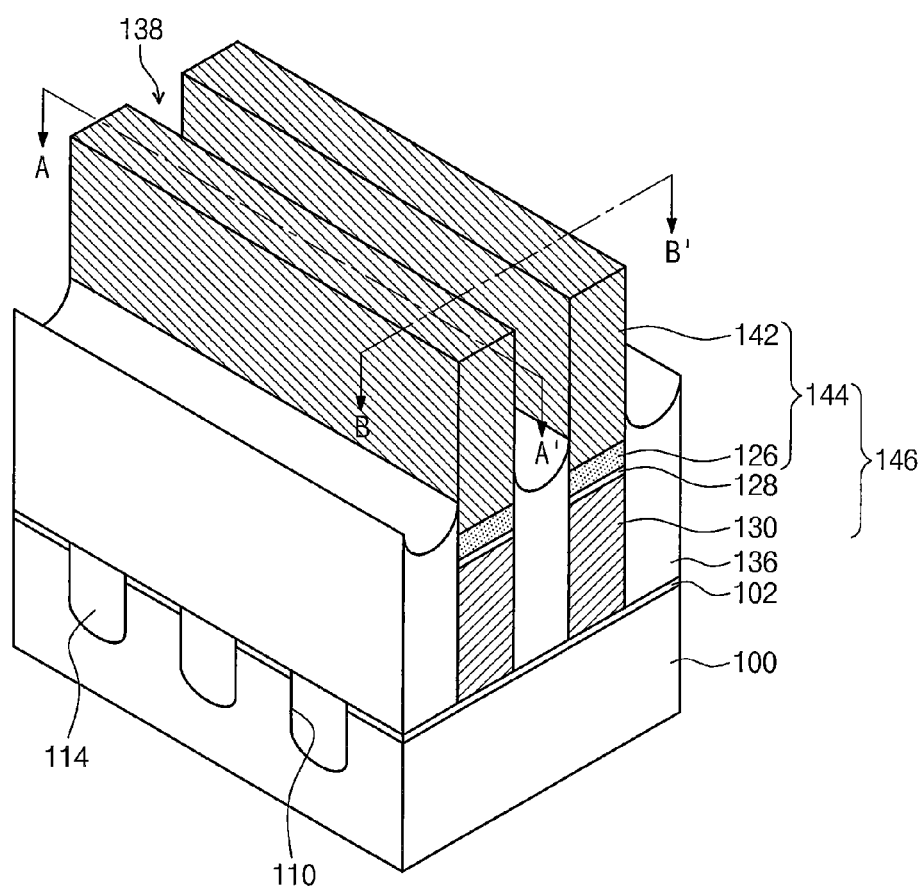
Figure 1O:
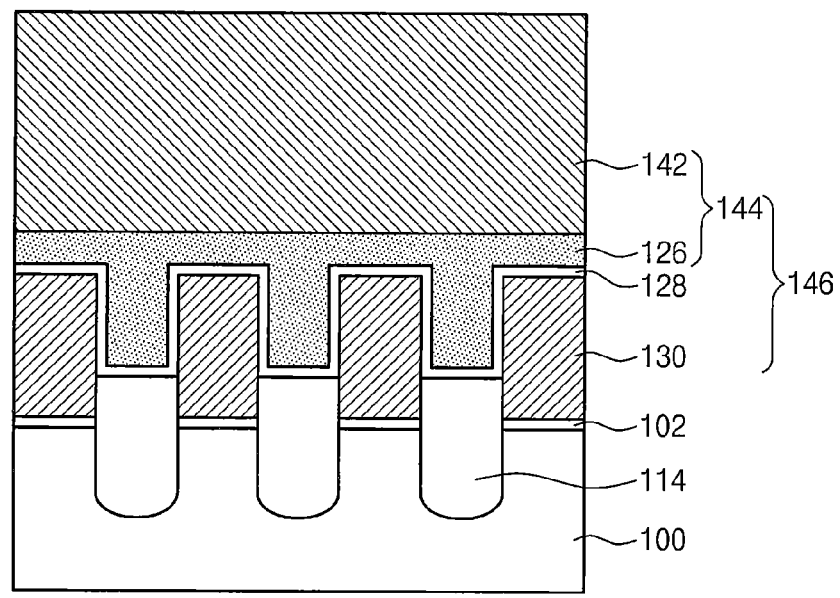
Figure 1P:
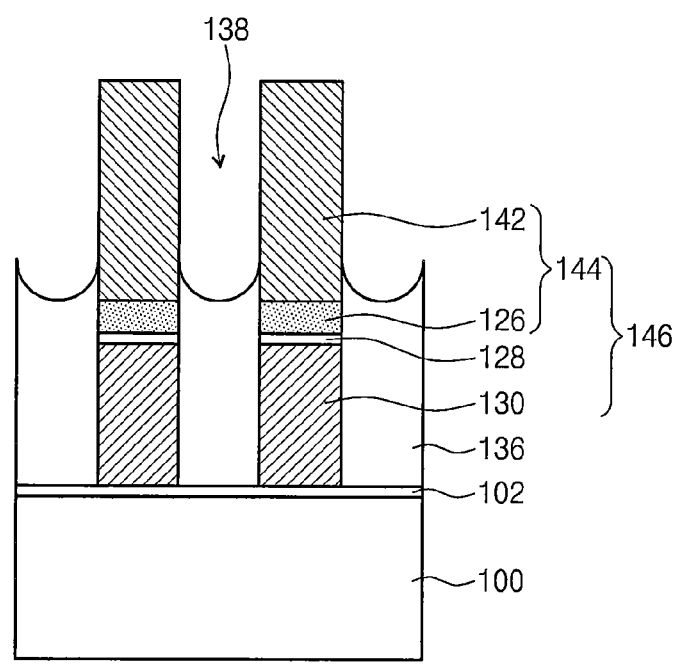

FIGS. 1A through 1N are perspective views for illustrating a method of manufacturing a semiconductor device in accordance with some embodiments of the inventive concept. FIG. 1O is a cross sectional view taken along the line A-A' of the semiconductor device illustrated in FIG. 1N. FIG. 1P is a cross sectional view taken along the line B-B' of the semiconductor device illustrated in FIG. 1N.

Referring to FIG. 1A, a tunnel insulating layer 102 may be formed on a substrate 100. The substrate 100 may include a semiconductor substrate such as a silicon (Si) substrate, a germanium (Ge) substrate and a silicon-germanium (Si—Ge) substrate, a silicon-on-insulator (SOI) substrate, a germanium-on-insulator (GOI) substrate, a silicon-germanium-on-insulator (SGOI) or the like. The tunnel insulating layer 102 may include, for example, a silicon oxide. The tunnel insulating layer 102 may be formed using a chemical vapor deposition (CVD) process, an atomic layer deposition (ALD) process or a thermal oxidation process.

Referring to FIG. 1B, a floating gate layer 104 may be formed on the tunnel insulating layer 102. The floating gate layer 104 may include silicon doped with an impurity, metal, a metal compound or combinations thereof. The floating gate layer 104 may be formed using a physical vapor deposition (PVD) process, a chemical vapor deposition (CVD) process and/or a sputtering processing.

Referring to FIG. 1C, a first mask 106 may be formed on the floating gate layer 104. More specifically, a first mask layer (not illustrated) may be formed on the floating gate layer 104. The first mask layer may include, for example, a silicon nitride. A photoresist pattern (not illustrated) may be formed on the first mask layer. The first mask layer may be etched using the photoresist mask as an etching mask to form the first mask 106. After the first mask 106 is formed, the photoresist pattern may be removed by an ashing process and a strip process. The first mask 106 may have a line shape extending in a first direction.

Referring to FIG. 1D, the floating gate layer 104, the tunneling insulating layer 102 and the substrate 100 may be etched to form a preliminary floating gate 108 and a trench 110. According to an embodiment of the inventive concept, the floating gate layer 104, the tunneling insulating layer 102 and the substrate 100 may be etched by an anisotropic etching process using the first mask 106. The anisotropic etching process may include a plasma etching process or a reactive ion etching (RIE) process. As a result of the anisotropic etching process, the preliminary floating gate 108 extending in the first direction may be formed. Also, the substrate 100 may be etched to a predetermined depth to form the trench 110 extending in the first direction. A first opening 112 limited by the preliminary floating gate 108 may be formed on the trench 110.

According to another embodiment of the inventive concept, a nitride liner (not illustrated) and a thermal oxidation layer (not illustrated) may be formed along an inner wall of the trench 110. The nitride liner and the thermal oxidation layer can cure an inner wall of the trench 110 damaged by the anisotropic etching process and can improve an electrical insulating property of a field region formed by filling the trench 110.

Referring to FIG. 1E, a field insulating layer 114 filling the trench 110 may be formed. According to some embodiments of the inventive concept, the field insulating layer 114 may be formed on the preliminary floating gate 108 to fill the trench 110. The field insulating layer 114 can cover the preliminary floating gate 108. The field insulating layer 114 can include, for example, a silicon oxide, a silicon nitride and/or a silicon oxynitride, among others. An upper portion of the field insulating layer 114 can be etched using an etching process such as an etched back. The first mask 106 can be removed while etching an upper portion of the field insulating layer 114. A top surface of the field insulating layer 114 may be formed at a position substantially higher than a top surface of the tunnel insulating layer 102. Thus, the field insulating layer 114 may be formed to cover a side surface of the tunnel insulating layer 102. A field area defining an active area may be formed by forming the field insulating layer 114 in the trench 110.

Referring to FIG. 1F, a dielectric layer 116 may be conformally formed on the preliminary floating gate 108 and the field insulating layer 114. The dielectric layer 116 may be continuously formed along a surface profile of the preliminary floating gate 108 and the field insulating layer 114. Also, the dielectric layer 116 may be formed not to fill the first opening 112.

According to some embodiments of the inventive concept, the dielectric layer 116 may have a multi layer structure such that a first oxide layer, a nitride layer and a second oxide layer may be stacked. For example, the first oxide layer, the nitride layer and the second oxide layer may include a silicon oxide, a silicon nitride and a silicon oxide, respectively.

According to other embodiments of the inventive concept, the dielectric layer 116 may include a metal oxide having a dielectric constant substantially higher than a silicon oxide. As examples of a metal oxide having a high dielectric constant, there may be tantalum oxide (TaOx), titanium oxide (TiOx), hafnium oxide (HfOx), zirconium oxide (ZrOx), aluminum oxide (AlOx), yttrium oxide (YOx), cesium oxide (CsOx), indium oxide (InOx), lanthanum oxide (LaOx), strontium titanium oxide (ScTiOx), plumbum titanium oxide (PbTiOx), strontium ruthenium oxide (ScRuOx), calcium ruthenium oxide (CaRuOx), nitride aluminum oxide (AlNxOy), hafnium silicate (HfSiOy), zirconium silicate (ZrSiOy), nitride hafnium silicate (HfNxSiyOz), nitride zirconium silicate (ZrNxSiyOz) and/or hafnium aluminate (HfAlOx), among others. The dielectric layer 116 may be formed from one or combinations of the materials mentioned above.

Referring to FIG. 1G, a first conductive layer 118 including silicon doped with a first impurity of a first concentration may be formed on the dielectric layer 116. More specifically, the first conductive layer 118 may be formed on the dielectric layer 116 while filling the first opening 112. The first conductive layer 118 may be formed using a low pressure chemical vapor deposition (LPCVD). After the first conductive layer 118 is formed, a planarization process may be performed to planarize an upper portion of the first conductive layer 118. Examples of a planarization process may include a chemical mechanical polishing (CMP) process and an etched back process, among others.

According to some embodiments of the inventive concept, the first impurity may include carbon (C), oxygen (O), nitrogen (N), germanium (Ge), arsenic (As), boron (B), fluorine (F) or combinations thereof. A doping of the first impurity may be performed by a diffusion process, an ion implantation process and/or an in-situ doping process.

Referring to FIG. 1H, a second conductive layer 120 including silicon doped with a second impurity of a second concentration may be formed on the first conductive layer 118. According to an embodiment of the inventive concept, the second conductive layer 120 may be formed using a low pressure chemical vapor deposition (LPCVD). Also, a doping of a second impurity may be performed using a diffusion process, an ion implantation process or an in-situ doping process. The second concentration may include carbon, oxygen, nitrogen, germanium, arsenic, boron, fluorine or combinations thereof. The second concentration of the second impurity may be substantially lower than the first concentration of the first impurity. Some embodiments provide that the first concentration may about ten times to thirty times as high as the second concentration.

Since the first concentration of the first conductive layer 118 may be about ten times to thirty times as high as the second concentration of the second conductive layer 120, it may be difficult for metal to diffuse into the first conductive layer 118 having a high concentration in a subsequent silidation process, thereby preventing metal from diffusing into the dielectric layer 116.

Referring to FIG. 1I, a second mask 122 may be formed on the second conductive layer 120. The second mask 122 can extend in a second direction substantially different from the first direction. For instance, the first and second directions may be perpendicular to each other. The second mask 122 may include, for example, a silicon nitride.

Referring to FIG. 1J, the second conductive layer 120, the first conductive layer 118, the dielectric layer 116 and the preliminary floating gate 108 may be etched to form a preliminary second conductive pattern 124, a first conductive pattern 126, a dielectric pattern 128 and a floating gate 130. In some embodiments, the second conductive layer 120, the first conductive layer 118, the dielectric layer 116, the preliminary floating gate 108 and the field insulating layer 114 may be etched by an anisotropic etching process using the second mask 122. Examples of anisotropic etching may include a plasma etching process or a reactive ion etching (RIE) process, among others.

As a result of the anisotropic etching, the preliminary second conductive pattern 124, the first conductive pattern 126 and the dielectric pattern 128 extending in the second direction may be formed. Also, the floating gate 130 having a hexahedral structure may be formed. Thus, a preliminary unit cell 132 including the floating gate 130, the dielectric pattern 128, the first conductive pattern 126 and the preliminary second conductive pattern 124 may be formed. If multiple preliminary unit cells 132 are formed, second openings 134 may be formed between adjacent ones of the preliminary unit cells 132.

According to other embodiments of the inventive concept, a portion of an upper portion of the field insulating layer 114 may be patterned during an anisotropic etching process.

Referring to FIG. 1K, an interlayer insulating layer 136 may be formed on the substrate 100 on which the preliminary unit cells 132 are formed. According to some embodiments of the inventive concept, the interlayer insulating layer 136 may be formed on the second mask 122 while filling the second openings 134. The interlayer insulating layer 136 may include an oxide, a nitride or an oxynitride. The oxide, the nitride or the oxynitride may include a silicon oxide, a silicon nitride or a silicon oxynitride, respectively.

Referring to FIG. 1L, a portion of an upper portion of the interlayer insulating layer 136 may be etched so as to expose a portion of the preliminary second conductive pattern 124. According to some embodiments of the inventive concept, the etched interlayer insulating layer 136 may be formed while covering the first conductive pattern. Also, the etched interlayer insulating layer 136 may partially cover a lower portion of the preliminary second conductive pattern 124.

The etching process may be performed by an etched back process or a wet etching process. Due to the nature of the etching process, the etched interlayer insulating layer 136 may have an uneven top surface. Also, a third opening 138 exposed through an etching process may be formed, which is limited by the preliminary second conductive pattern 124.

Referring to FIG. 1M, a metal layer 140 may be conformally formed on the preliminary second conductive pattern 124 and the interlayer insulating layer 136. The metal layer 140 may be continuously formed along a surface profile of the preliminary second conductive pattern 124 and the interlayer insulating layer 136. Also, the metal layer 140 may be formed so as not to fill the third opening 138. The metal layer 140 may include metal and/or metal compound. For instance, the metal layer 140 may include titanium (Ti), tantalum (Ta), nickel (Ni), cobalt (Co), molybdenum (Mo) and/or tungsten (W), among others. The metal layer 140 may be formed from one or combinations of the materials mentioned above. Also, the metal layer 140 may be formed by a physical vapor deposition (PVD) process and/or a sputtering process.

Referring to FIGS. 1N through 1P, the preliminary second conductive pattern 124 can be converted into a second conductive pattern 142 including metal silicide by performing a silidation process. More specifically, first, a first thermal process may be performed on the preliminary second conductive pattern 124 and the metal layer 140. Polysilicon and metal included in the preliminary second conductive pattern 124 and the metal layer 140 respectively can be converted into metal silicide. After the first thermal process is performed, unreacted polysilicon or unreacted metal may be removed through a cleaning process. The second conductive pattern 142 including metal silicide having chemically stable structure may be formed by performing a second thermal process. Metal silicide may include cobalt silicide ($CoSi_x$), nickel silicide ($NiSi_x$), molybdenum silicide ($MoSi_x$), titanium silicide ($TiSi_x$), tantalum silicide ($TaSi_x$) and/or combinations thereof.

In a subsequent thermal process, metal of the metal layer 140 may diffuse into the preliminary second conductive pattern 124. The metal may diffuse into a place adjacent to the first conducive pattern 126 but it may be difficult for the metal to diffuse into the first conductive pattern 126. This may be because an impurity concentration of the first conductive pattern 126 may be substantially higher than an impurity concentration of the second conductive pattern 142 and thereby a diffusion of metal may be not easy. For instance, the subsequent thermal process may be performed at a temperature higher than 850° C. Since a diffusion of metal of the second conductive pattern 142 is suppressed by the first conductive pattern 126 during a subsequent thermal process, a thermal resistance of a semiconductor device including the first and second conductive patterns 126 and 142 can be obtained.

As a result, a control gate 144 including the first and second conductive patterns 126 and 142 may be formed. Also, a unit cell 146 including the control gate 144, the dielectric pattern 128 and the floating gate 130 may be formed.

Figure 2A:
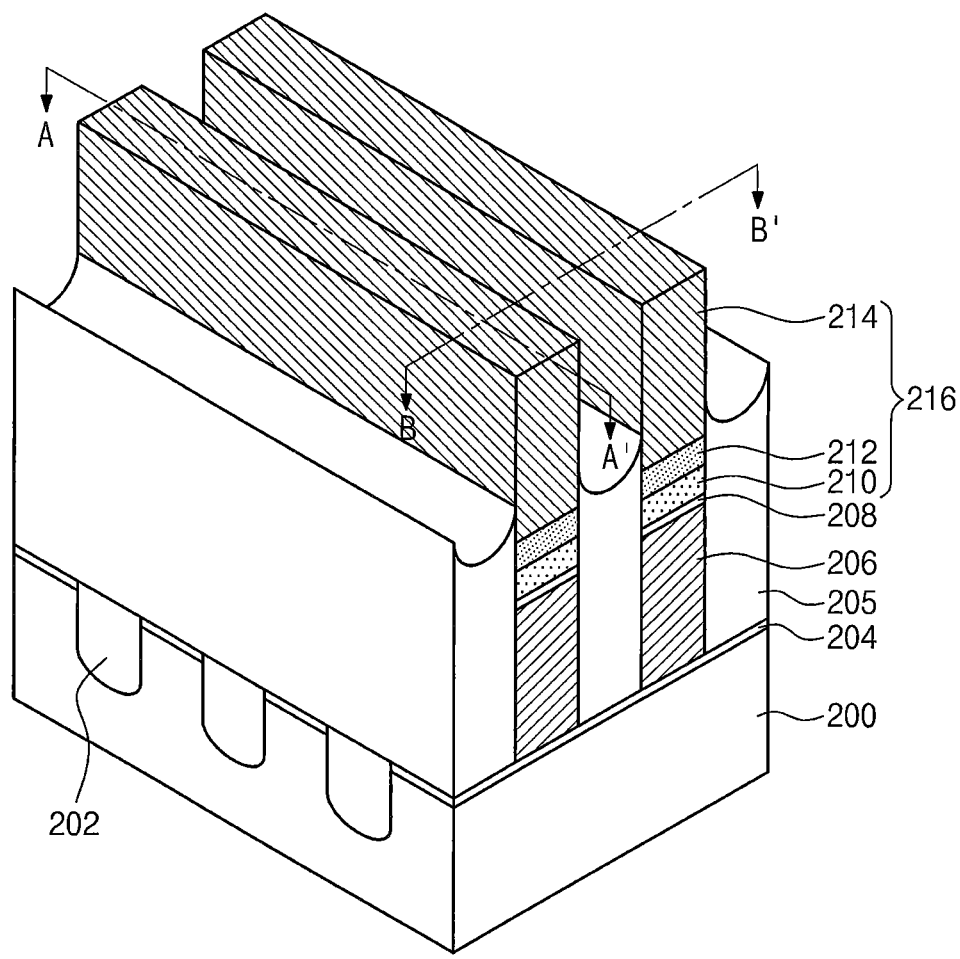
FIG. 2A is a perspective view for illustrating a semiconductor device in accordance with some embodiments of the inventive concept.
Figure 2B:
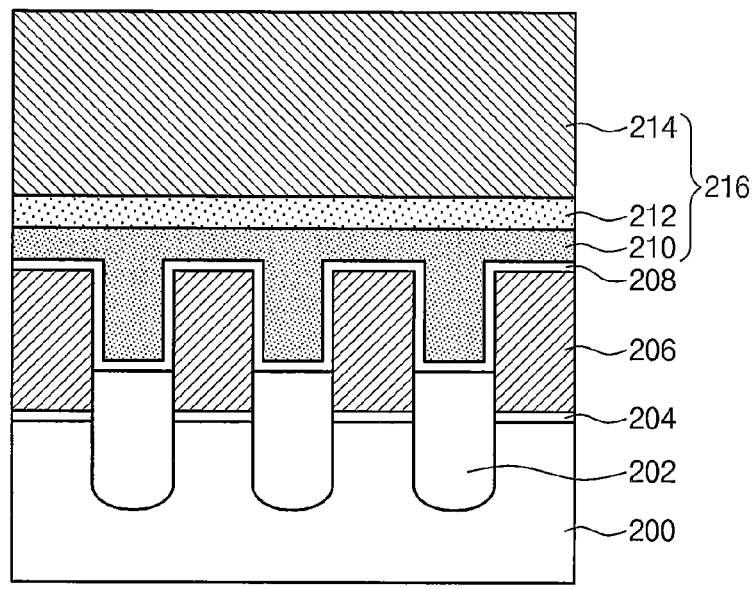
FIGS. 2B and 2C are cross sectional views taken along the lines A-A' and B-B' of the semiconductor device illustrated in FIG. 2A, respectively.
Figure 2C:
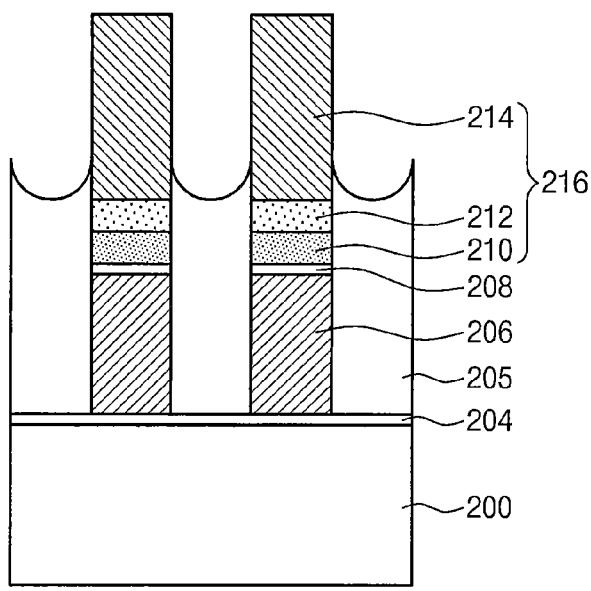

FIG. 2A is a perspective view for illustrating a semiconductor device in accordance with some other embodiments of the inventive concept. FIG. 2B is a cross sectional view taken along the lines A-A' of the semiconductor device illustrated in FIG. 2A. FIG. 2C is a cross sectional view taken along the lines B-B' of the semiconductor device illustrated in FIG. 2A.

Referring to FIGS. 2A through 2C, a semiconductor device may include a field insulating layer 202, a tunnel insulating layer 204, a floating gate 206, a dielectric pattern 208 and a control gate 216 formed on a substrate 200.

The field insulating layer 202 may include a lower portion extending from a surface of the substrate 200 in a downward direction and an upper portion extending from a surface of the substrate 200 in an upward direction. The field insulating layer 202 functions as a field area and an active area extending in a first direction may be defined by the field area.

The tunnel insulating layer 204 may be formed on a surface of the substrate 200 and may have a top surface substantially lower than a top surface of the field insulating layer 202.

The floating gate 206 may have a hexahedral structure and may be formed on the tunnel insulating layer 204. The floating gate 206 may have a top surface substantially higher than a top surface of the filed insulating layer 202.

The dielectric pattern 208 can be formed to extend in a second direction substantially different from the first direction. For instance, the first and second directions may be perpendicular to each other. The dielectric pattern 208 may be conformally formed on the field insulating layer 202 and the floating gate 206.

The control gate 216 may be formed on the dielectric pattern 208 to extend in the second direction and may include a first conductive pattern 210, a second conductive pattern 212 and a third conductive pattern 214 sequentially stacked. The first conductive pattern 210 may include silicon doped with a first impurity of a first concentration. The first impurity may include carbon, oxygen, nitrogen, germanium, arsenic, boron, fluorine or compounds thereof. Also, the first conductive pattern 210 may be formed on the dielectric pattern 208 and may be formed while filling a concave part generated due to a step difference between the floating gate 206 and the field insulating layer 202. The second conductive pattern 212 may include silicon doped with a second impurity of a second concentration. For instance, the second concentration may be about ten times through thirty times as high as the first concentration. The third conductive pattern 214 may include metal silicide doped with a third impurity of a third concentration. The third concentration may be substantially lower than the second concentration. In some embodiments, the third concentration may be the about the same as the first concentration. For instance, the third concentration may be about $1/10$ through $1/30$ as low as the second concentration. Since the concentration of the second conductive pattern 212 may be substantially higher than the concentrations of the first and third conductive patterns 210 and 214, it may not be easy for metal of the third conductive pattern 214 to diffuse into the second conductive pattern 212. Thus, diffusion of the metal into the dielectric pattern 208 may be suppressed.

A semiconductor device in accordance with some embodiments of the inventive concept may be formed using methods similar to the manufacturing methods of the semiconductor device described in FIGS. 1A through 1P. Embodiments may further include forming a conductive layer having a concentration substantially lower than the first conductive layer 118 before forming the first conductive layer 118 described in FIG. 1G of the first embodiment.

Figure 3A:
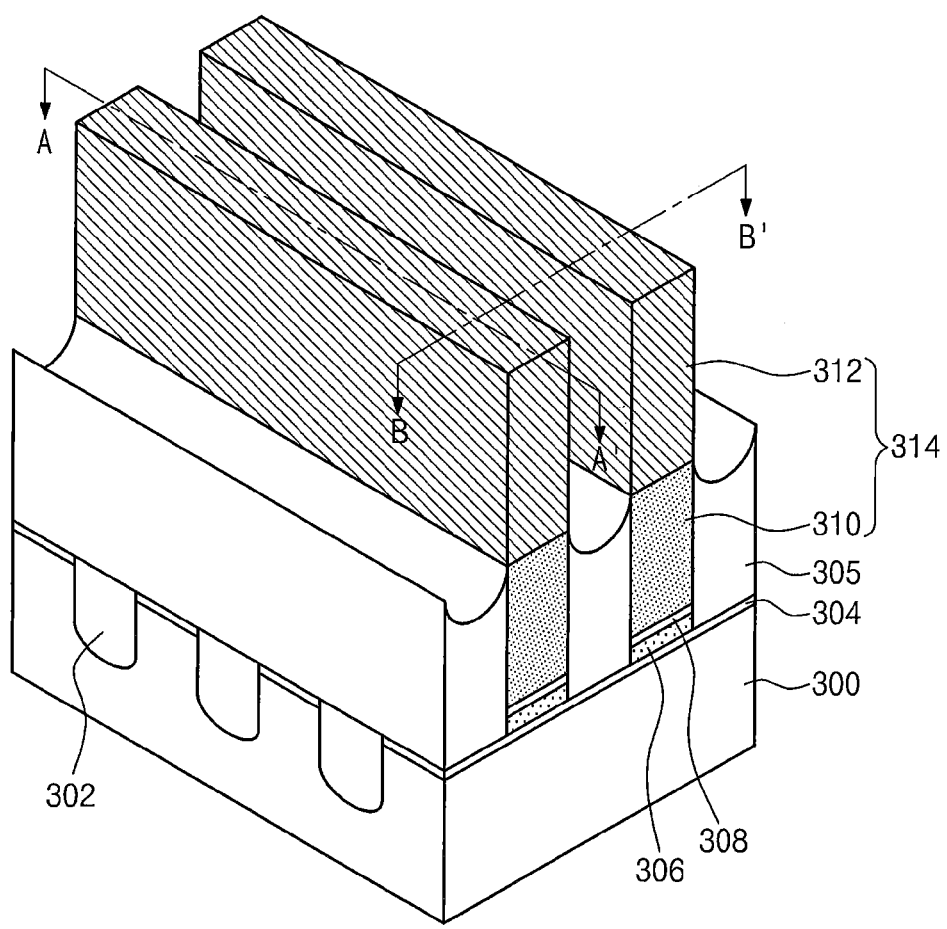
FIG. 3A is a perspective view for illustrating a semiconductor device in accordance with some other embodiments of the inventive concept.
Figure 3B:
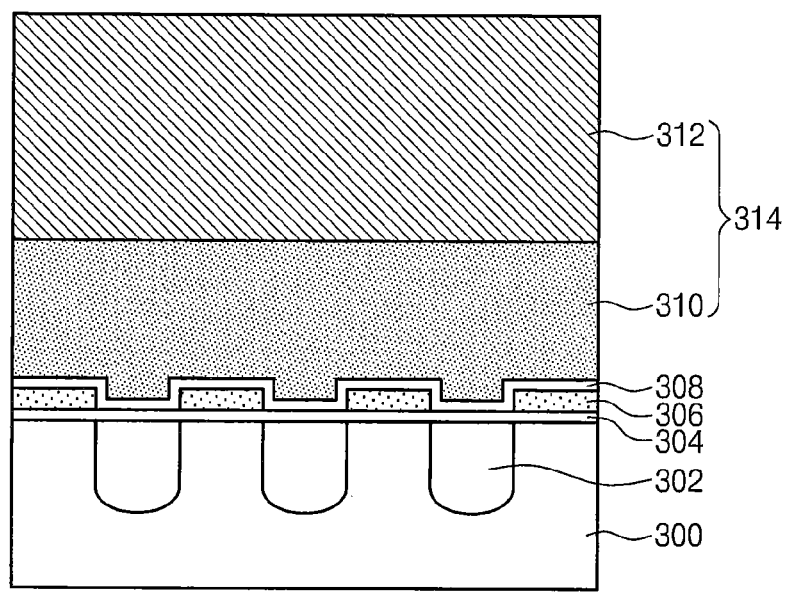
FIGS. 3B and 3C are cross sectional views taken along the lines A-A' and B-B' of the semiconductor device illustrated in FIG. 3A, respectively.
Figure 3C:
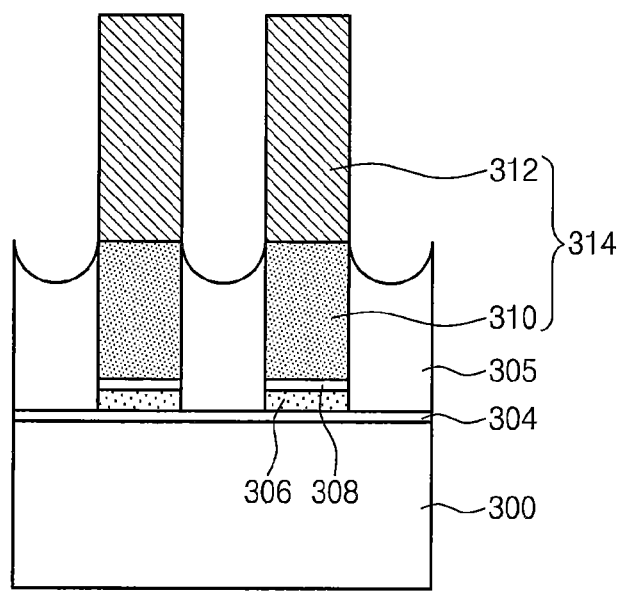

FIG. 3A is a perspective view for illustrating a semiconductor device in accordance with still other embodiments of the inventive concept. FIG. 3B is a cross sectional view taken along the lines A-A' of the semiconductor device illustrated in FIG. 3A. FIG. 3C is a cross sectional view taken along the lines B-B' of the semiconductor device illustrated in FIG. 3A.

Referring to FIGS. 3A through 3C, a semiconductor device may include a field insulating layer 302, a tunnel insulating layer 304, a charge trap layer 306, a blocking insulating layer 308 and a gate 314 that are formed on a substrate 300.

The field insulating layer 302 may have a structure extending from a surface of the substrate 300 in a downward direction. An active area extending in a first direction may be defined by the field insulating layer 302.

The tunnel insulating layer 304 may be formed on the substrate 300 in which the field insulating layer 302 is formed. The tunnel insulating layer 304 may include, for example, a silicon oxide.

The charge trap layer 306 may be formed on the tunnel insulating layer 304. The charge trap layer 306 may include a nitride, a nanocrystal material, an oxide and/or combinations thereof. For instance, the charge trap layer 306 may include a silicon nitride, an aluminum oxide, a hafnium oxide and/or combinations thereof. As an example of nanocrystal material, there may be silicon (Si), a silicon germanium (SiGe), tungsten (W), cobalt (Co), molybdenum (Mo), a cadmium selenium (CdSe) and tungsten nitride (WN).

The blocking insulating layer 308 may include, for example, a silicon oxide or a metal oxide. As an example of a metal oxide, there may be an aluminum oxide, a hafnium oxide, a zirconium oxide and lanthanum oxide.

In FIGS. 3A through 3C, the charge trap layer 306 and the blocking insulating layer 308 are patterned. However, the charge trap layer 306 and the blocking insulating layer 308 may not be patterned.

The gate 314 may include a first conductive pattern 310 and a second conductive pattern 312 that are sequentially stacked and extend in a second direction. The first conductive pattern 310 may include silicon doped with a first impurity of a first concentration. The first impurity may include carbon, oxygen, nitrogen, germanium, arsenic, boron, fluorine or compounds thereof. Also, the first conductive pattern 310 may be formed on the blocking insulating layer 308. The second conductive pattern 312 may include metal silicide doped with a second impurity of a second concentration. The second concentration may be substantially lower than the first concentration. For instance, the first concentration is about ten times through thirty times as high as the second concentration. The second impurity may include carbon, oxygen, nitrogen, germanium, arsenic, boron, fluorine or compounds thereof. Since an impurity concentration of the first conductive pattern 310 is substantially higher than an impurity concentration of the second conductive pattern 312, it may be not easy for metal of the second conductive pattern 312 to diffuse into the first conductive pattern 310. Thus, diffusion of the metal into the blocking insulating layer 308 may be suppressed.

A semiconductor device in accordance with some embodiments of the inventive concept may be formed using methods similar to the manufacturing methods of the semiconductor devices described in FIGS. 1A through 1P. In a semiconductor device in accordance with the some embodiments of the inventive concept, the floating gate 130 as illustrated in FIGS. 1J through 1P may correspond to the charge trap layer 306 as illustrated in FIGS. 3A through 3C and the dielectric pattern 128 as illustrated in FIGS. 1J through 1P may correspond to the blocking insulating layer 308 as illustrated in FIGS. 3A through 3C.

Figure 4A:
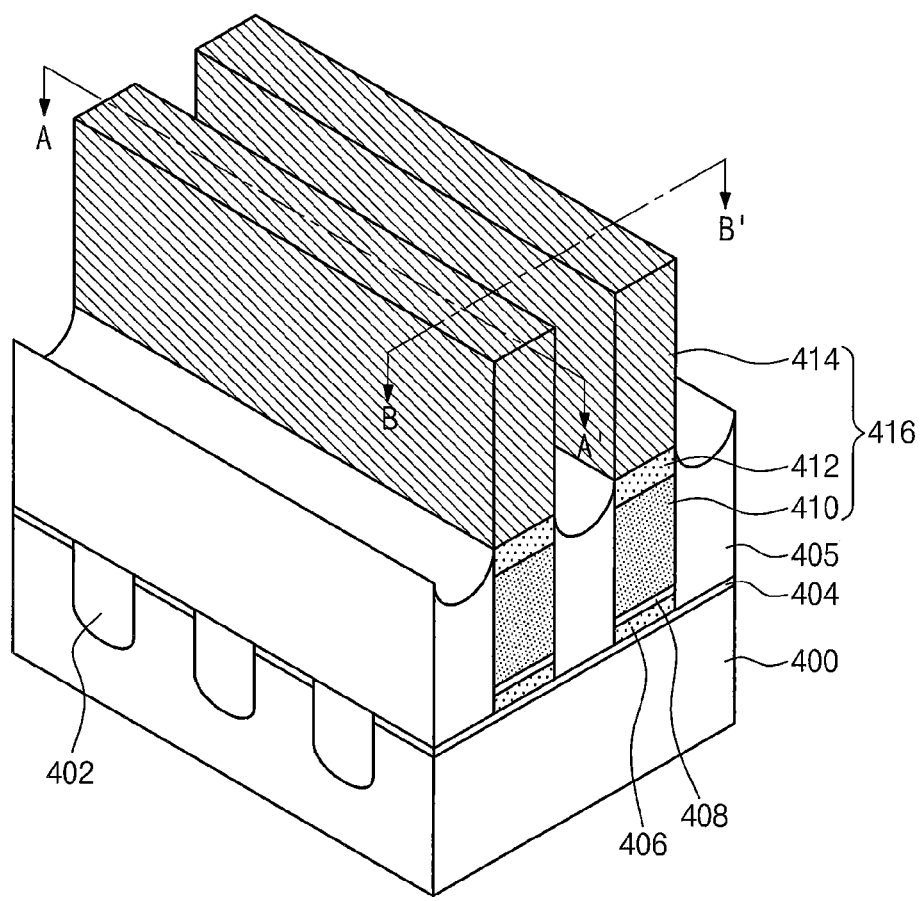
FIG. 4A is a perspective view for illustrating a semiconductor device in accordance with yet other embodiments of the inventive concept.
Figure 4B:
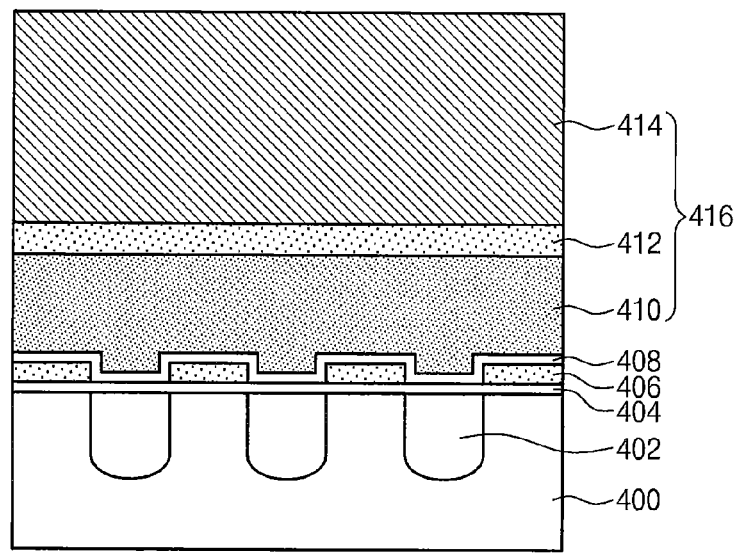
FIGS. 4B and 4C are cross sectional views taken along the lines A-A' and B-B' of the semiconductor device illustrated in FIG. 4A, respectively.
Figure 4C:
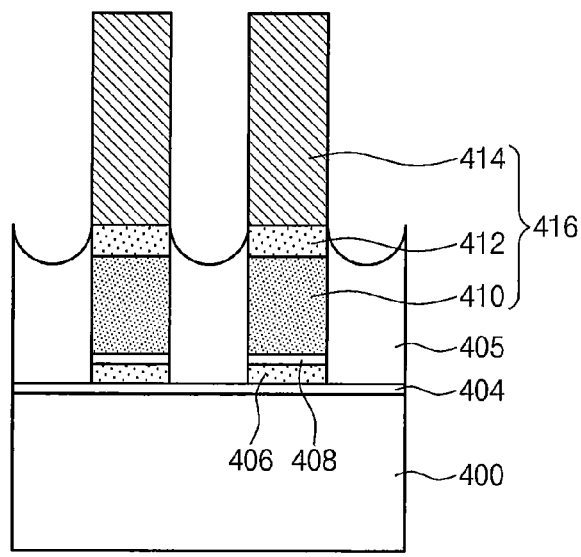

FIG. 4A is a perspective view for illustrating a semiconductor device in accordance with some embodiments of the inventive concept. FIG. 4B is a cross sectional view taken along the lines A-A' of the semiconductor device illustrated in FIG. 4A. FIG. 4C is a cross sectional view taken along the lines B-B' of the semiconductor device illustrated in FIG. 4A.

Referring to FIGS. 4A through 4C, a semiconductor device may include a field insulating layer 402, a tunnel insulating layer 404, a charge trap layer 406, a blocking insulating layer 408 and a gate 416 that are formed on a substrate 400.

The gate 416 may include a first conductive pattern 410, a second conductive pattern 412 and a third conductive pattern 414. The first conductive pattern 410 may include silicon doped with a first impurity of a first concentration. The first impurity may include carbon (C), oxygen (O), nitrogen (N), germanium (Ge), arsenic (As), boron (B), fluorine (F) and/or combinations thereof. The second conductive pattern 412 may include silicon doped with a second impurity of a second concentration. The second concentration may be substantially higher than the first concentration. For instance, the second concentration may be about ten times through thirty times as high as the first concentration. The second impurity may include carbon (C), oxygen (O), nitrogen (N), germanium (Ge), arsenic (As), boron (B), fluorine (F) or combinations thereof. The third conductive pattern 414 may include metal silicide doped with a third impurity of a third concentration. The third concentration may be substantially lower than the second concentration. Also, the third concentration may be about the same as the first concentration. For instance, the third concentration may be about 1/10 through 1/30 as low as the second concentration. Since the concentration of the second conductive pattern 412 is substantially higher than the concentrations of the first and third conductive patterns 410 and 414, it may not be easy for metal of the third conductive pattern 414 to diffuse into the second conductive pattern 412. Thus, diffusion of the metal into the blocking insulating layer 408 may be suppressed.

Since a description of the field insulating layer 402, the tunnel insulating layer 404, the charge trap layer 406, the blocking insulating layer 408 and the gate 416 as illustrated in FIGS. 4A through 4C may be substantially similar to the description of the field insulating layer 302, the tunnel insulating layer 304, the charge trap layer 306, the blocking insulating layer 308 and the gate 314 as discussed above, the description thereof will be omitted.

Figure 8A:
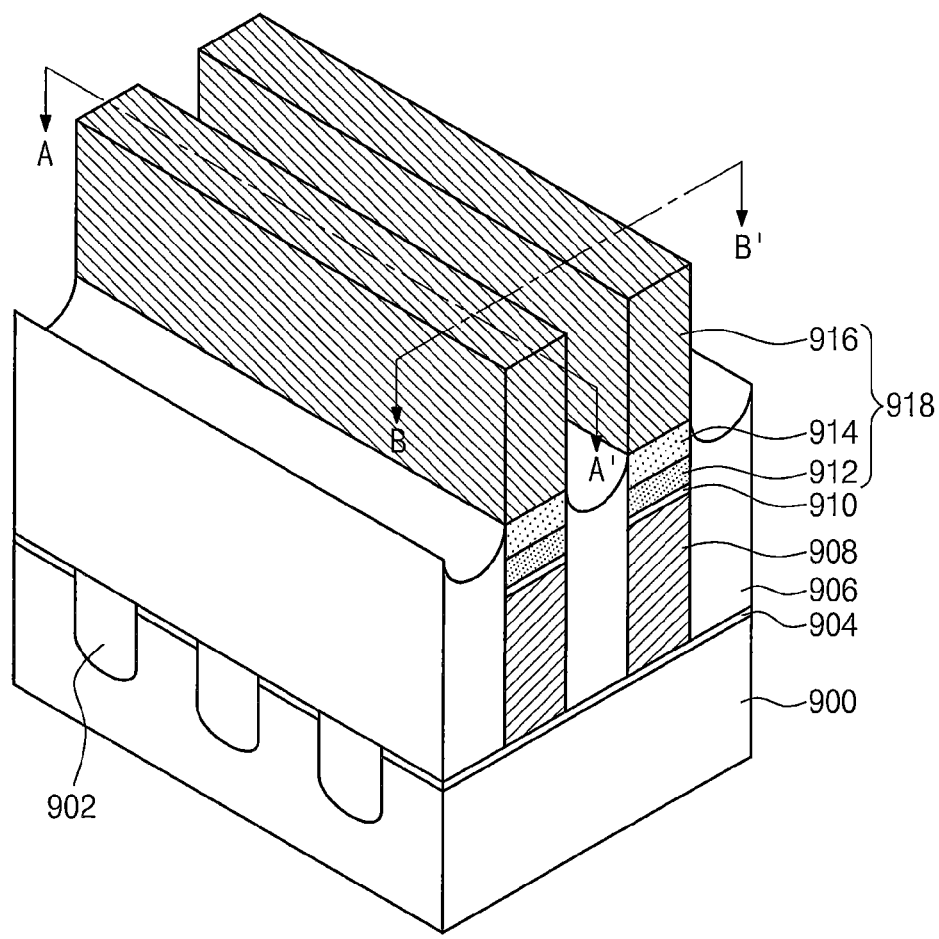
FIG. 8A is a perspective view for illustrating a semiconductor device in accordance with some other embodiments of the inventive concept.
Figure 8B:
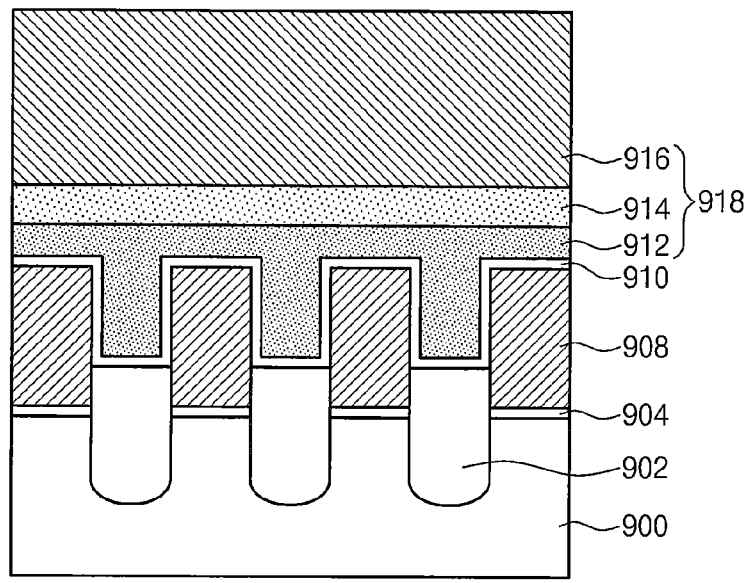
FIGS. 8B and 8C are cross sectional views taken along the lines A-A' and B-B' of the semiconductor device illustrated in FIG. 8A, respectively.
Figure 8C:
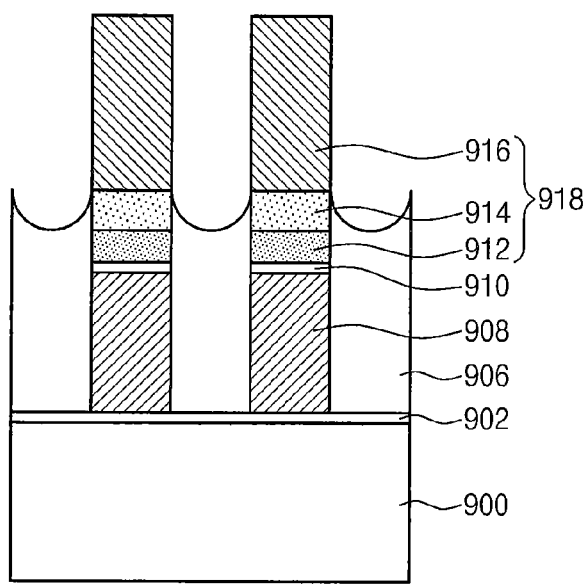

FIG. 8A is a perspective view for illustrating a semiconductor device in accordance with still yet another embodiment of the inventive concept. FIG. 8B is a cross sectional view taken along the lines A-A' of the semiconductor device illustrated in FIG. 8A. FIG. 8C is a cross sectional view taken along the lines B-B' of the semiconductor device illustrated in FIG. 8A.

Referring to FIGS. 8A through 8C, a semiconductor device may include a field insulating layer 902, a tunnel insulating layer 904, a floating gate 908, a dielectric pattern 910 and a control gate 918 that are formed on a substrate 900.

The control gate 918 may be formed on the dielectric pattern 910 to extend in a second direction and may include a first conductive pattern 912, a second conductive pattern 914 and a third conductive pattern 916 that are sequentially stacked.

The first conductive pattern 912 may include silicon doped with a first impurity of first concentration. The first impurity may include carbon, oxygen, nitrogen, germanium, arsenic, boron, fluorine and/or combinations thereof. Also, the first conductive pattern 912 may be formed on the dielectric pattern 910 and may be formed while filling a recessed portion generated as a result of a step difference between the floating gate 908 and the field insulating layer 902.

The second conductive pattern 914 may include silicon doped with a second impurity of second concentration. The second concentration may be substantially lower than the first concentration. For instance, the second concentration may be about one tenth to one thirtieth of the first concentration. A side of the second conductive pattern 914 may be covered with an interlayer insulating layer.

The third conductive pattern 916 may include metal silicide doped with a third impurity of third concentration. The third concentration may be substantially lower than the first concentration. The third concentration may be the substantially same with the second concentration. For instance, the third concentration may be about one tenth to one thirtieth of the first concentration.

Since the concentration of the first conductive pattern 912 is substantially higher than the concentrations of the second and third conductive patterns 914 and 916, metal in the third conductive pattern 916 may not easily diffuse into the first conductive pattern 912 in a subsequent thermal process. Therefore, metal diffusion into the dielectric pattern 910 may be suppressed.

The semiconductor device in accordance with such embodiments of the inventive concept may be formed in a manner similar to the method of manufacturing a semiconductor device described in FIGS. 1A through 1P. Semiconductor devices in accordance with FIGS. 8A through 8C may include the second conductive pattern 914 including polysilicon having the same concentration as the third conductive pattern 916 because in embodiments as illustrated in FIGS. 1M and 1N may include a portion which is not directly in contact with the conductive layer 140 by virtue of the interlayer insulating layer 136 not being reacted to silicon.

Although not described in detail, the semiconductor devices described in the embodiments of FIGS. 2A through 4C may also have a portion that is not reacted to silicon because the portion is not directly in contact with the conductive layer by the interlayer insulating layer. Thus, the semiconductor device may further include a polysilicon layer under the conductive pattern including metal silicide.

Figure 5:
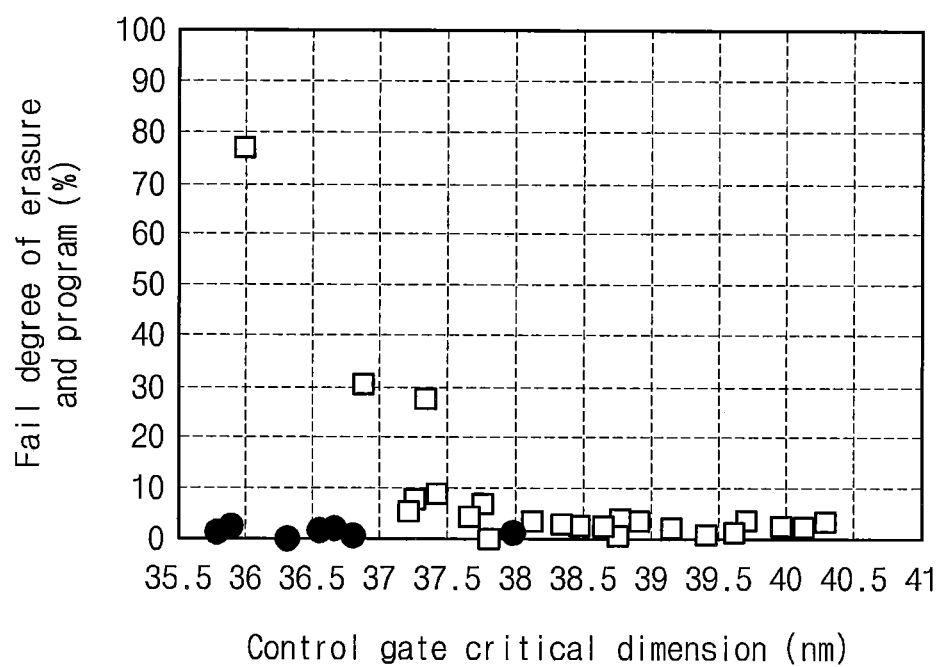
FIG. 5 is a graph showing the degree of fail of erasure and program operations of a semiconductor device relative to a critical dimension of a control gate of a semiconductor device in accordance with some embodiments of the inventive concept.

FIG. 5 is a graph showing the degree of fail of erasure and program operations of a semiconductor device relative to a critical dimension of a control gate of a semiconductor device in accordance with embodiments of the inventive concept. An X axis of FIG. 5 represents a critical dimension of a gate of a semiconductor device and may be in units of nanometers (nm). A Y axis of FIG. 5 represents the degree of fail of an erasure operation and a program operation of semiconductor device as expressed in percentage (%).

In FIG. 5, a circle point (-•-) is a semiconductor device formed by the manufacturing method described in FIGS. 1A through 1O. Briefly describing, the semiconductor device includes the floating gate 130, the dielectric pattern 128 and the gate 144 including the first and second conductive patterns 126 and 142. The first conductive pattern 126 includes polysilicon doped with a carbon impurity of about 3.0%. The second conductive pattern 142 includes cobalt silicide doped with a carbon impurity of about 0.4%.

In FIG. 5, a square point (-□-) is a general semiconductor device. Briefly describing, the semiconductor device includes a floating gate, a dielectric pattern and a gate including first and second conductive pattern. The first conductive pattern includes polysilicon doped with a carbon impurity of about 0.4%. The second conductive pattern includes cobalt silicide doped with a carbon impurity of about 0.4%.

In the case that a critical dimension of the control gate 144 of the circle point (-•-) and a critical dimension of the control gate of the square point (-□-) are at least 38 nm, a fail bit degree of erasure and program operations of the semiconductor device of the circle point (-•-) and the semiconductor device of the square point (-□-) is very low (a few percent).

However, in a case of the square point (-□-), if a critical dimension of the control gate becomes smaller than 37 nm, a fail bit degree of erasure and program operations of the semiconductor device of the square point (-□-) gradually becomes high in the range of about 25% through about 80%. In a case of the circle point (-•-), even though a critical dimension of the control gate 144 becomes smaller than 37 nm, a fail bit degree of erasure and program operations of the semiconductor device is very low (a few percent).

As the concentration of the first conductive pattern 126 is higher than the concentration of the second conductive pattern 142, a fail bit degree of erasure and program operations of the semiconductor device is greatly reduced. This is because an impurity concentration of the first conductive pattern 126 is higher than an impurity concentration of the second conductive pattern 142 and thereby a metal diffusion of the second conductive pattern 142 is suppressed. Therefore, it can be prevented for metal of the second conductive pattern 142 to diffuse into the dielectric pattern 128. As a result, a fail bit degree of erasure and program operations of the semiconductor device including the first conductive pattern 126 doped with an impurity having a concentration higher than the second conductive pattern 142 can be greatly reduced.

Figure 6A:
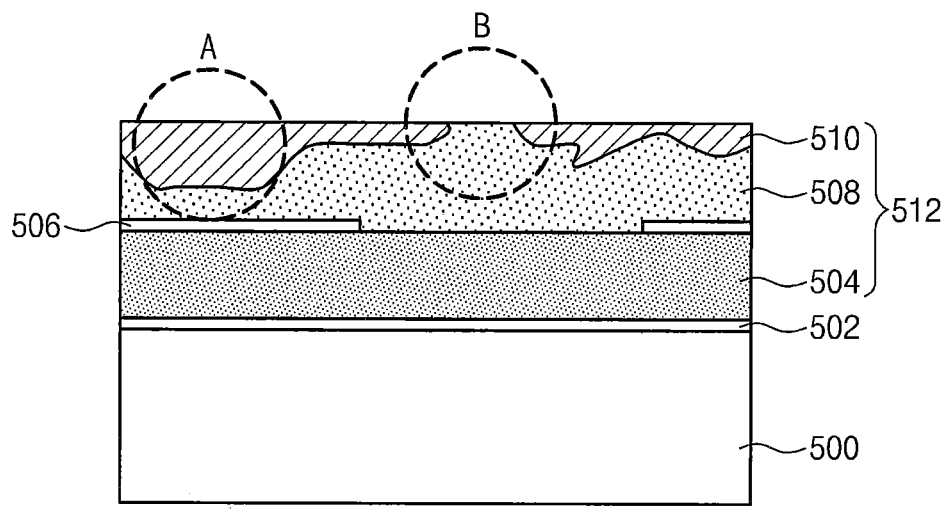
FIGS. 6A and 6B are schematic views of TEM image of the transistors illustrating a distribution of metal diffusion when a silidation process is performed.
Figure 6B:
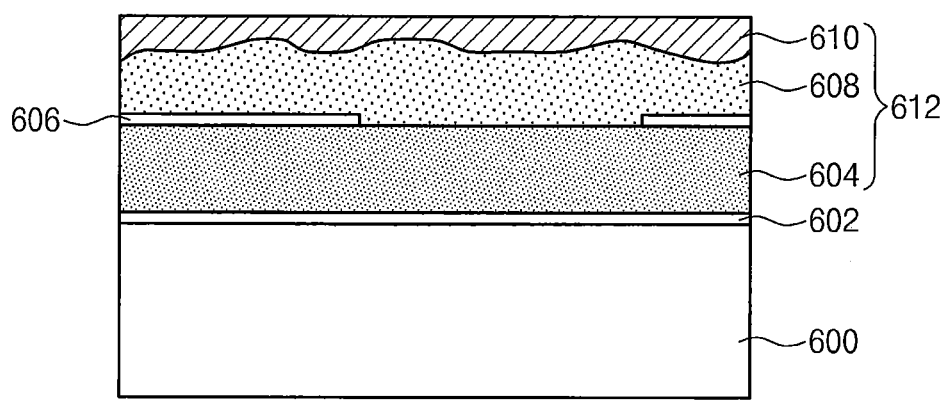

FIGS. 6A and 6B are schematic views of TEM image of the transistors illustrating a distribution of metal diffusion when a silidation process is performed. In FIGS. 6A and 6B, a transistor is applied to an experiment example. A transistor is formed in a peripheral region while a semiconductor device (a flash memory) in accordance with embodiments of the inventive concept is formed in a cell region. The tunnel insulating layer 102 described with reference to FIGS. 1N through 1P is functioned as gate insulating layers 502 and 602. The floating gate 130 and the control gate 144 described with reference to FIGS. 1N through 1P are electrically connected to each other by a butting process to function as gate electrodes 512 and 612.

In FIG. 6A, a gate electrode 512 of a first transistor includes a floating gate 504, a first conductive pattern 508 including polysilicon not doped with an impurity and a second conductive pattern 510 including cobalt silicide not doped with an impurity. In FIG. 6B, a gate electrode 612 of a second transistor includes a floating gate 604, a first conductive pattern 608 including polysilicon doped with carbon of 4.0% and a second conductive pattern 610 including cobalt silicide doped with carbon of 0.3%.

Referring to FIG. 6A, a cobalt silicide layer of the second conductive pattern 510 of the first transistor is severed. This is because the second conductive pattern is not doped with an impurity and thereby cobalt in the second conductive pattern cannot uniformly diffuse and a portion in which cobalt absolutely does not diffuse is generated due to an agglomeration and a lack of cobalt. Thus, a cobalt silicide layer of the second conductive pattern has an agglomerate portion like A and a severed portion like B.

Referring to FIG. 6B, a cobalt silicide layer of the second conductive pattern 610 of the second transistor is continuously formed. This is because the second conductive pattern 610 is doped with carbon impurity and thereby in the second conductive pattern 610, a portion in which cobalt is agglomerated or a portion which lacks cobalt is not generated. Thus, a cobalt silicide layer of the second conductive pattern 610 is continuously formed without a cut.

Silicon doped with carbon can diffuse cobalt more uniformly compared with silicon not doped with carbon. Thus, an electric resistance of the second conductive pattern 610 of the second transistor is lower than an electric resistance of the second conductive pattern 510 of the first transistor.

In the present embodiment, a transistor in which a floating gate and a control gate are electrically connected to each other through a butting process is described as an example. The transistor may be a select transistor and a ground transistor of a flash memory. However, the present experiment example may be applied to a transistor of a dynamic random access memory (DRAM) or a general interconnection.

Figures 6C, 6D:
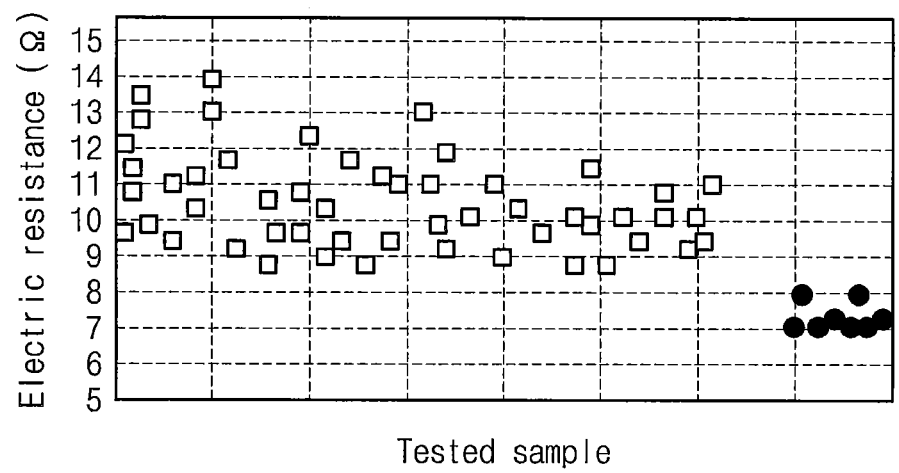
FIG. 6C is a graph showing an electric resistance of the transistors illustrated in FIGS. 6A and 6B.
FIG. 6D is a graph showing an electric resistance of contacts connected to the transistors illustrated in FIGS. 6A and 6B.

FIG. 6C is a graph showing an electric resistance of the transistor illustrated in FIGS. 6A and 6B. In FIG. 6C, an X axis represents tested sample and a Y axis represents a resistance. A unit of a resistance is an ohm (a).

Electric resistances of the gate electrode 512 of the first transistor and the gate electrode 612 of the second transistor are measured respectively. A square point (-☐-) of FIG. 6C is an electric resistance of the gate electrode 512 of the first transistor and has a resistance value of about 8.5Ω through about 14Ω. A circle point (-•-) of FIG. 6C is an electric resistance of the gate electrode 612 of the second transistor and has a resistance value of about 7Ω through about 8 Ω.

Referring to FIG. 6C, the second transistor including the gate electrode 612 doped with carbon has an electric resistance lower than the first transistor including the gate electrode 512 not doped with carbon.

As described in FIGS. 6A and 6B, a cobalt silicide layer of the first transistor has an agglomerated portion or a severed portion. However, a cobalt silicide layer of the second transistor is continuously formed and thereby the second transistor has an electric resistance lower than the first transistor.

FIG. 6D is a graph showing an electric resistance of contacts connected to the transistor illustrated in FIGS. 6A and 6B. In FIG. 6D, an X axis represents a substrate and a Y axis represents an electric resistance. A unit of the electric resistance is an ohm (Ω). A first contact electrically connected to the first transistor is formed and an electric resistance of the first contact is measured. A second contact electrically connected to the second transistor is formed and an electric resistance of the second contact is measured. A square point (-☐-) of FIG. 6D is an electric resistance of the first contact and has a resistance value of about 1,000Ω through about 1,700Ω. A circle point (-•-) of FIG. 6D is an electric resistance of the second contact and has a resistance value of about 500Ω through about 700 Ω.

Referring to FIG. 6D, the second contact connected to the second transistor including the gate electrode 612 doped with an impurity has an electric resistance lower than the first contact connected to the first transistor including the gate electrode 512 not doped with an impurity.

As described in FIGS. 6A and 6B, a cobalt silicide layer of the first transistor has an agglomerated portion or a severed portion. However, a cobalt silicide layer of the second transistor is continuously formed and thereby the second contact connected to the second transistor has an electric resistance lower than the first contact connected to the first transistor.

Figure 7A:
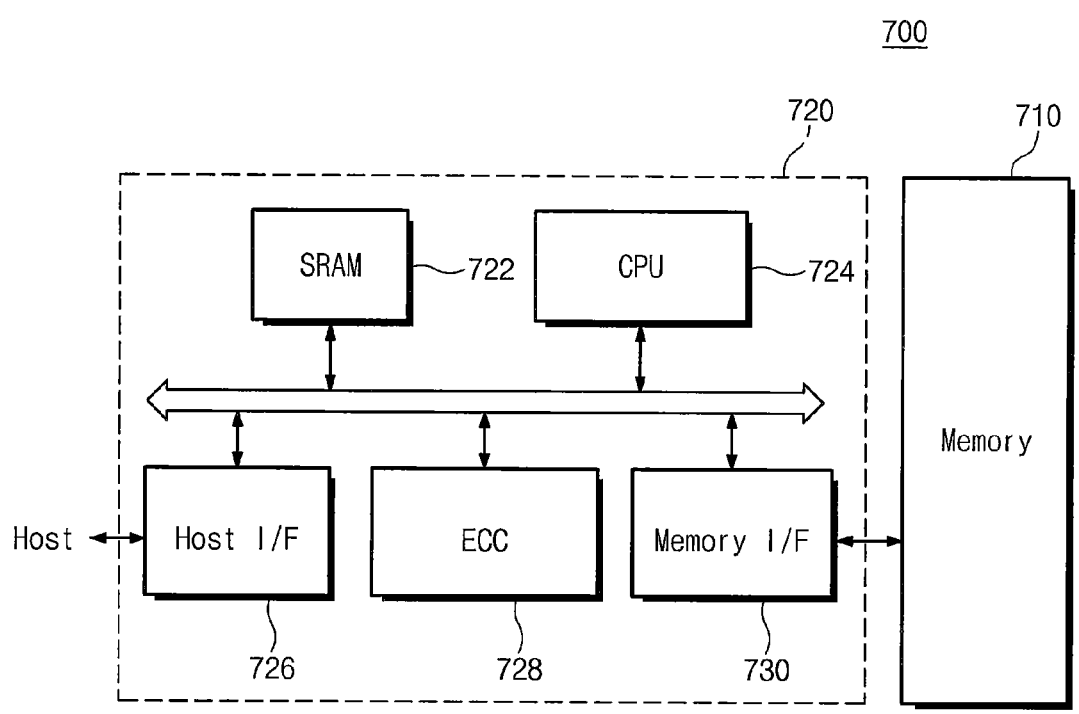
FIG. 7A is a block diagram illustrating a memory card including a semiconductor device in accordance with some embodiments of the inventive concept.

FIG. 7A is a block diagram illustrating a memory card including a semiconductor device in accordance with some embodiments of the inventive concept. Referring to FIG. 7A, a memory including a semiconductor device manufactured by some embodiments of the inventive concept described above can be applied to a memory card 700. As an illustration, the memory card 700 may include a memory 710 and a memory controller 720 controlling the whole data exchanges between a host and the memory 710. A static random access memory (SRAM) 722 may be used as an operation memory of a central processing unit (CPU) 724. A host interface 726 may include a data exchange protocol of the host connected to the memory card 700. An error correction code 728 can detect and correct an error included in data read from the memory 710. A memory interface 730 interfaces with the memory 710. The central processing unit (CPU) 724 performs the whole control operations for data exchange of the memory controller 720.

The memory 710 applied to the memory card 700 may include a semiconductor device manufactured by the embodiment of the inventive concept. In this case, a silicon layer having a concentration higher than an upper portion of a gate is formed in a lower portion of a gate and thereby it can be prevented that metal of an upper portion of a gate diffuses into a lower portion of a gate to penetrate a dielectric pattern. Thus, an electrical characteristic of a semiconductor device including the gate can be improved.

Figure 7B:
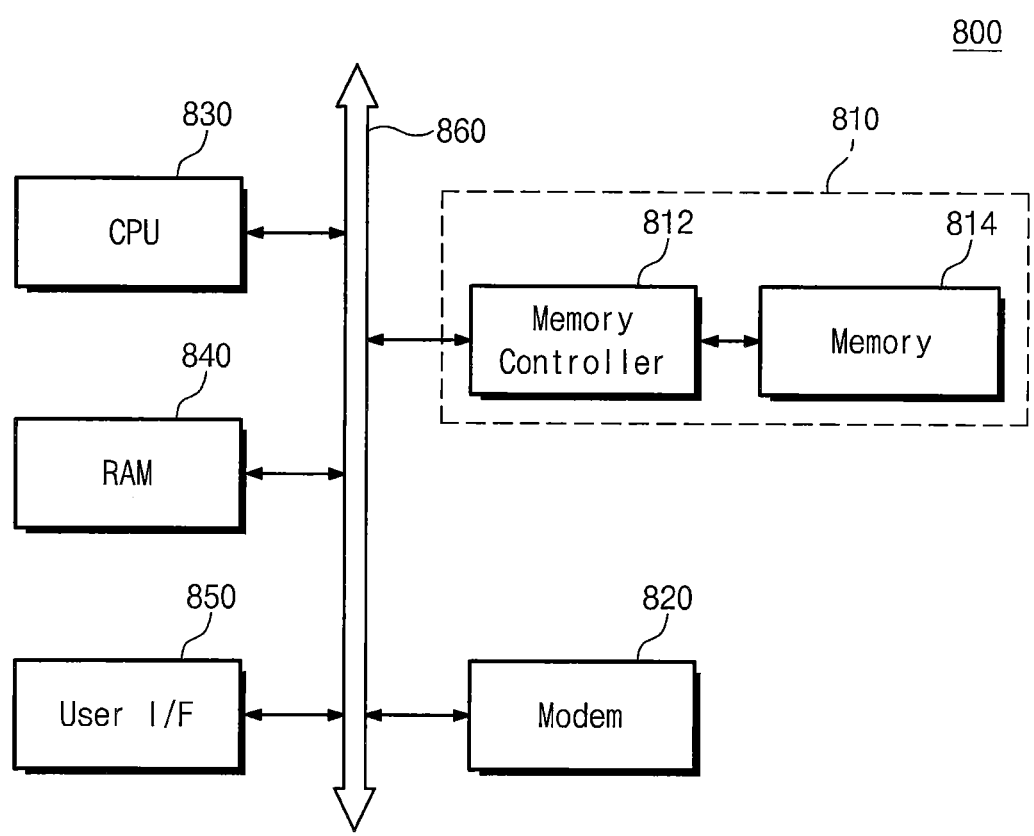
FIG. 7B is a block diagram illustrating an information processing system applying a semiconductor device in accordance with some embodiments of the inventive concept.

FIG. 7B is a block diagram illustrating an information processing system applying a semiconductor device in accordance with embodiments of the inventive concept. Referring to FIG. 7B, an information processing system 800 may include a memory system 810 including the semiconductor device in accordance with some embodiments of the inventive concept. The information processing system 800 may include a mobile equipment or a computer. As an illustration, the information processing system 800 may include the memory system 810, and a modem 820, a central processing unit (CPU) 830, a random access memory (RAM) 840 and a user interface 850 that are electrically connected to a system bus 860. The memory system 810 may store data processed by the central processing unit (CPU) 830 and data received from the outside. The memory system 810 may include a memory 812 and a memory controller 814 and may be constituted to be the same with the memory card 700 described with reference to FIG. 7A. The information processing system 800 may be provided to a memory card, a solid state drive, a camera image sensor and application chipsets. As an illustration, the memory system 810 may be constituted by a solid state drive and in this case, the information processing system 800 can stably and reliably store huge amounts of data in the memory system 810.

According to embodiments of the inventive concept, a first conductive pattern including silicon having a relatively high concentration may prevent metal of a second conductive pattern from diffusing into a dielectric pattern. Thus, an electric reliability of a semiconductor device including a control gate having the first and second conductive patterns may be improved.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A peripheral transistor in a semiconductor device, the peripheral transistor comprising:
    a gate layer on a substrate in a peripheral region of the substrate;
    a dielectric pattern on the gate layer, the dielectric pattern including an opening that exposes the gate layer;
    a first conductive pattern on the dielectric pattern and in contact with the gate layer via the opening to electrically connect the first conductive pattern to the gate layer, the first conductive pattern including a first concentration of Carbon; and
    a second conductive pattern on the first conductive pattern, the second conductive pattern including a second concentration of Carbon, wherein the first concentration is greater than the second concentration.

2. The peripheral transistor of claim 1 wherein the first conductive pattern includes a third concentration of Boron.

3. The peripheral transistor of claim 1 wherein the dielectric pattern comprises an oxide-nitride-oxide pattern.

4. The peripheral transistor of claim 1 wherein the first conductive pattern is doped to include the first concentration of Carbon.

5. The peripheral transistor of claim 4 wherein the first conductive pattern comprises polysilicon doped to include the first concentration of Carbon.

6. The peripheral transistor of claim 1 wherein the first concentration of Carbon is sufficient to prevent diffusion of a metal through the first conductive pattern into the dielectric pattern to maintain a program/erase failure rate of the semiconductor device at less than about 5%.

7. The peripheral transistor of claim 1 wherein the first concentration is about 10 times to about 30 times greater than the second concentration.

8. The peripheral transistor of claim 1 wherein the first concentration is about 4.0% Carbon and the second concentration is about 0.3% Carbon.

9. The peripheral transistor of claim 1 wherein the first concentration is about 3.0% Carbon and the second concentration is about 0.4% Carbon.

10. The peripheral transistor of claim 1 further comprising:
    a gate insulating layer between the gate layer and the substrate.

11. The peripheral transistor of claim 1, wherein the semiconductor device further comprises:
    a non-volatile memory cell transistor including a control gate having a critical dimension of less than 37 nm.

12. The peripheral transistor of claim 1 wherein the first conductive pattern and the second conductive pattern comprise a continuous conductive pattern including first and second portions including the first concentration of Carbon in the first portion and including the second concentration of Carbon in the second portion.

13. The peripheral transistor of claim 1 wherein the opening in the dielectric pattern exposes an exposed portion of the gate layer and wherein the dielectric pattern covers a covered portion of the gate layer.

14. A transistor in a non-volatile memory device, the transistor comprising:
    a gate layer on a substrate;
    a dielectric pattern on the gate layer;
    a first polysilicon pattern on the dielectric pattern, the first polysilicon pattern doped to include a first concentration of Carbon; and
    a second polysilicon pattern on the first polysilicon pattern, the second polysilicon pattern including a second concentration of Carbon, wherein the first concentration is greater than the second concentration.

15. The transistor of claim 14 wherein the transistor comprises a select transistor or a ground transistor in a peripheral region of the non-volatile memory device.

16. The transistor of claim 14 wherein the gate layer comprises a floating gate layer included in a non-volatile memory cell in a memory cell region of the non-volatile memory device.

17. The transistor of claim 14 wherein the dielectric pattern includes an opening that exposes an exposed portion of the gate layer and wherein the dielectric pattern covers a covered portion of the gate layer; and
    wherein the first polysilicon pattern contacts the exposed portion of the gate layer in the opening to electrically connect the first conductive pattern to the gate layer.

18. The transistor of claim 14 wherein the first polysilicon pattern and the second polysilicon pattern comprise a continuous polysilicon pattern including first and second portions including the first concentration of Carbon in the first portion and including the second concentration of Carbon in the second portion.

19. The transistor of claim 14 wherein the first concentration is substantially greater than the second concentration.

20. The transistor of claim 14 wherein the first concentration is about 10 times to about 30 times greater than the second concentration.

21. The transistor of claim 14 wherein the first concentration is about 4.0% Carbon and the second concentration is about 0.3% Carbon.

22. The transistor of claim 14 wherein the first concentration is about 3.0% Carbon and the second concentration is about 0.4% Carbon.

23. The transistor of claim 14 wherein the first polysilicon pattern includes a third concentration of Boron.

24. The transistor of claim 14 wherein the dielectric pattern comprises an oxide-nitride-oxide pattern.

25. A peripheral transistor in a semiconductor device, the peripheral transistor comprising:
    a first gate layer on a substrate in a peripheral region of the substrate;
    a dielectric pattern on the first gate layer, the dielectric pattern including an opening that exposes the first gate layer;
    a second gate layer on the dielectric pattern and in contact with the first gate layer via the opening to electrically connect the second gate layer to the first gate layer, the second gate layer doped to include a first concentration of a first impurity; and
    a third gate layer on the second gate layer, the third gate layer including a second concentration of a second impurity, wherein the first concentration is greater than the second concentration.

26. The peripheral transistor of claim 25 wherein the first concentration is about 10 times to about 30 times greater than the second concentration.

27. The peripheral transistor of claim 25 wherein the second gate layer and the third gate layer comprise a continuous gate layer including first and second portions including the first concentration in the first portion and including the second concentration in the second portion.

28. A peripheral transistor in a semiconductor device, the peripheral transistor comprising:
    a gate layer on a substrate in a peripheral region of the substrate;
    a dielectric pattern on the gate layer, the dielectric pattern including an opening that exposes the gate layer; and
    a conductive pattern on the dielectric pattern and in contact with the gate layer via the opening to electrically connect the conductive pattern to the gate layer, the conductive pattern comprising a continuous conductive pattern including a first portion having a first concentration of Carbon and the continuous conductive pattern including a second portion including a second concentration of Carbon, wherein the first concentration is greater than the second concentration.

29. The peripheral transistor of claim 28 wherein the first portion of the conductive pattern includes a third concentration of Boron.

30. The peripheral transistor of claim 28 wherein the first concentration is about 10 times to about 30 times greater than the second concentration.

* * * * *